US012693600B2

(12) United States Patent
Imam et al.

(10) Patent No.: US 12,693,600 B2
(45) Date of Patent: Jul. 28, 2026

(54) CONTROL VOLTAGE THRESHOLD SELECTION TO FACILITATE MULTIFOCAL IMAGING

(71) Applicant: Cymer, LLC, San Diego, CA (US)

(72) Inventors: Md Hossain Toufiq Imam, San Diego, CA (US); Rabin Paudel, Portland, OR (US); Gamaralalage G. Padmabandu, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 127 days.

(21) Appl. No.: 18/707,814

(22) PCT Filed: Nov. 14, 2022

(86) PCT No.: PCT/US2022/049842
§ 371 (c)(1),
(2) Date: May 6, 2024

(87) PCT Pub. No.: WO2023/096768
PCT Pub. Date: Jun. 1, 2023

(65) Prior Publication Data
US 2025/0370346 A1      Dec. 4, 2025

Related U.S. Application Data

(60) Provisional application No. 63/283,804, filed on Nov. 29, 2021.

(51) Int. Cl.
*G03F 7/00*          (2006.01)
*H01S 3/00*          (2006.01)
*H01S 3/10*          (2006.01)

(52) U.S. Cl.
CPC ...... *G03F 7/70041* (2013.01); *G03F 7/70575* (2013.01); *H01S 3/0057* (2013.01); *G03F 7/0037* (2013.01); *H01S 3/10046* (2013.01)

(58) Field of Classification Search
CPC ............. G03F 7/70025; G03F 7/70033; G03F 7/70041; G03F 7/7055; G03F 7/7057; H01S 3/10023; H01S 3/105; H01S 3/1055
See application file for complete search history.

(56) References Cited

U.S. PATENT DOCUMENTS 6,192,064 B1      2/2001   Algots et al.
8,144,739 B2      3/2012   Figueroa et al.
(Continued)

FOREIGN PATENT DOCUMENTS

TW            202043944 A      12/2020
WO       2019079010 A1       4/2019
(Continued)

OTHER PUBLICATIONS

Michiel Claessen, European International Searching Authority, International Search Report and Written Opinion, counterpart PCT Application PCT/US2022/049842, mailed Apr. 17, 2023, 11 total pages.

*Primary Examiner* — Steven H Whitesell
(74) *Attorney, Agent, or Firm* — DiBerardino McGovern IP Group LLC

(57) ABSTRACT

Disclosed is an apparatus and method for use in a system in which light pulses of different wavelengths are generated by moving an optical element connected to an actuator and in which the actuator is driven by a command voltage having a threshold cap depending on a position of a pulse in a burst of pulses.

18 Claims, 16 Drawing Sheets

200

(56)        References Cited

U.S. PATENT DOCUMENTS

| | | | |
|---|---|---|---|
| 2005/0083983 | A1 | 4/2005 | Sandstrom et al. |
| 2005/0286598 | A1 | 12/2005 | Sandstrom et al. |
| 2016/0299441 | A1 * | 10/2016 | Ahlawat ............. G03F 7/70575 |
| 2020/0301286 | A1 | 9/2020 | Conley et al. |
| 2022/0390851 | A1 | 12/2022 | Fujii et al. |
| 2023/0229088 | A1 * | 7/2023 | Yamanaka .......... H01S 3/08009 |
| | | | 430/311 |
| 2024/0042544 | A1 * | 2/2024 | Yamanaka ........... B23K 26/705 |

FOREIGN PATENT DOCUMENTS

| | | | |
|---|---|---|---|
| WO | 2021091730 | A1 | 5/2021 |
| WO | 2021186741 | A1 | 9/2021 |

* cited by examiner

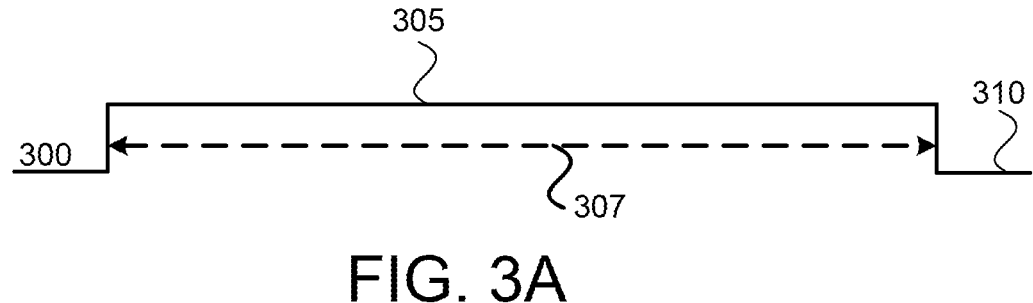
FIG. 3A
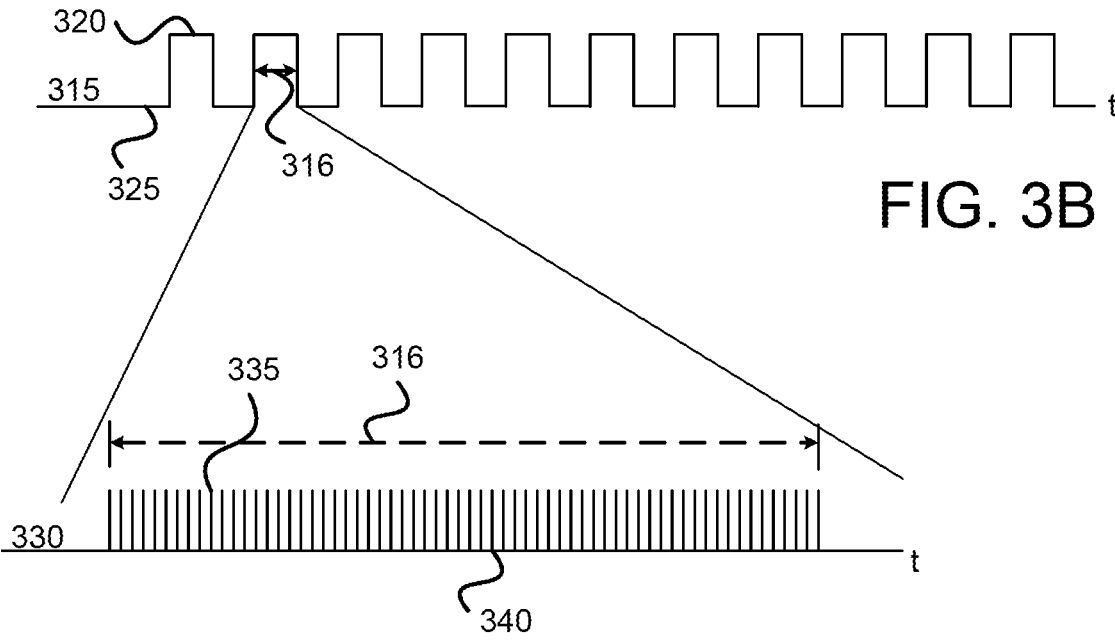
FIG. 3B
FIG. 3C

FIG. 10A

FIG. 10B pulse index x 10⁴

Wt.err (arb. units)

1

CONTROL VOLTAGE THRESHOLD SELECTION TO FACILITATE MULTIFOCAL IMAGING

CROSS REFERENCE TO RELATED APPLICATIONS

This application claims priority to U.S. Application No. 63/283,804, filed Nov. 29, 2021, titled CONTROL VOLTAGE THRESHOLD SELECTION TO FACILITATE MULTIFOCAL IMAGING, which is incorporated herein in its entirety by reference.

TECHNICAL FIELD

The present disclosure relates to methods of and apparatus for using deep ultraviolet ("DUV") radiation to form multiple aerial images in a single lithography exposure pass. The systems described herein may be used, for example, to form a three-dimensional semiconductor component.

BACKGROUND

Photolithography is a process by which semiconductor circuitry is patterned on a substrate such as a silicon wafer. A photolithography optical source provides the DUV light used to expose a photoresist on the wafer. DUV light for photolithography is generated by excimer optical sources. Often, the optical source is a laser source and the pulsed light beam is a pulsed laser beam. The light beam is passed through a beam delivery unit, a reticle or a mask, and then projected onto a prepared silicon wafer. In this way, a chip design is patterned onto a photoresist that is then etched and cleaned, and then the process repeats.

For some applications it is desirable to provide for patterning at more than one depth on the wafer. For two depths the wavelengths of successive pulses are alternated pulse-to-pulse between a first and second wavelength, with pulses having the first wavelength focusing at a first level and pulses having the second wavelength focusing at a second level by virtue of the difference in wavelength. To accomplish this an element in the optical train is moved back-and-forth between two angular positions with the source generating light having the first wavelength when the element is in one of the positions and generating light having the second wavelength when the element is in the other of the positions. The element is moved under the control of a command voltage by an electro-actuatable element (EAE), e.g., a piezoelectric transducer (PZT), a stepper motor, a valve, a pressure-controlled device, an electromagnet, a solenoid, another type of piezoelectric device, a linear motor, an hydraulic actuator, a voice coil, and/or any other type of device capable of generating a motive force under the command of a control signal.

Generally speaking, the speed at which the EAE must be driven, and the magnitude of the mechanical motion the EAE must produce, requires driving the EAE towards the limits of its capabilities. In particular, care must be taken not to apply excessive voltage to (overdrive) the EAE, otherwise the EAE could be damaged. At the same time, the EAE must be driven in such a way that wavelength control is not compromised. It is in this context that embodiments of the disclosed subject matter arise.

SUMMARY

The following presents a succinct summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to an aspect of an embodiment, there is disclosed a laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the laser apparatus comprising a trigger for initiating the burst of pulses, a pulse counter for providing a running count of a number of pulses that have occurred in the burst of pulses, an EAE mechanically coupled to the optical element to control the position of the optical element under control of a voltage command signal, and a voltage controller electrically connected to the EAE and arranged to receive the running count from the pulse counter and adapted to generate the voltage command signal, with the voltage controller applying a first voltage cap to the voltage command signal from when the burst is initiated to when the running count is at a first predetermined value and applying a second voltage cap to the voltage command signal after the running count exceeds the first predetermined value.

The first predetermined value may be a running count at which the EAE is at an end of an undershoot region of its voltage response behavior. The voltage controller may apply a third voltage cap to the voltage command signal after the running count exceeds a second predetermined value equal to a running count at which the EAE is at an end of an overshoot region of its voltage response behavior. The first voltage cap is greater than the second voltage cap.

According to another aspect of an embodiment there is disclosed a laser apparatus adapted to generate a first plurality of pulses of laser radiation having a first wavelength interspersed with a second plurality of pulses of laser radiation having a second wavelength different from the first wavelength, the laser apparatus comprising a pulse counter for providing a running count of a number of pulses that have occurred in the burst of pulses, an EAE mechanically coupled to the optical element to determine the position of the optical element under control of a voltage command signal to alter respective wavelengths of pulses in the burst of pulses based at least in part on the position of the optical element, and a controller electrically connected to the EAE and arranged to receive the count from the pulse counter and adapted to generate the command signal, the controller being adapted to change a cap applied to the command signal based at least in part on the running count.

One of the plurality of predetermined values may be a running count at which the EAE is at an end of an undershoot region of its voltage response behavior. One of the plurality of predetermined values may be a running count at which the EAE is at an end of an overshoot region of its voltage response behavior.

One of the plurality of predetermined values may be a running count at which the EAE is at an end of an undershoot region of its voltage response behavior and a second one of the plurality of predetermined values may be a running count at which the EAE is at an end of an overshoot region of its voltage response behavior, and the first voltage cap may be greater than the second voltage cap.

According to another aspect of an embodiment there is disclosed a method of operating a laser apparatus adapted to generate a burst of pulses of laser radiation including a first plurality of pulses of laser radiation having a first wavelength and a second plurality of pulses of laser radiation having a second wavelength different from the first wavelength based at least in part on a position of an optical element in an optical assembly of the laser apparatus, the position of the optical element being determined by an EAE mechanically coupled to the optical element, the method comprising generating the burst of pulses, and, simultaneously with generating the burst of pulses, counting a number of pulses that have occurred in the burst of pulses to provide a running count of the pulses, and generating a command voltage for the EAE, the command voltage having a voltage cap based at least in part on the running count.

The first voltage cap may be applied to the command voltage from when the burst is initiated to when the running count is at a first predetermined value and a second voltage cap may be applied to the command voltage when the running count is at a second predetermined value. The first predetermined value may be a running count at which the EAE is at an end of an undershoot region of its voltage response behavior. The second predetermined value may be a running count at which the EAE is at an end of an overshoot region of its voltage response behavior. The first predetermined value may be a running count at which the EAE is at an end of an undershoot region of its voltage response behavior, the second predetermined value may be a running count at which the EAE is at an end of an overshoot region of its voltage response behavior, and the first voltage cap may be greater than the second voltage cap.

Further embodiments, features, and advantages of the present invention, as well as the structure and operation of the various embodiments, are described in detail below with reference to accompanying drawings.

BRIEF DESCRIPTION OF THE DRAWINGS

FIGS. 3A-3C are plots of data that relate to the production of pulses and/or bursts of pulses in an optical source.

FIG. 10A is a graph depicting the dynamics of a typical EAE stage in response to fixed amplitude dithering voltage.

FIG. 10B is a graph showing the fixed amplitude dithering voltage driving the EAE stage used to produce the dynamics shown in FIG. 10A.

Figure 1A:
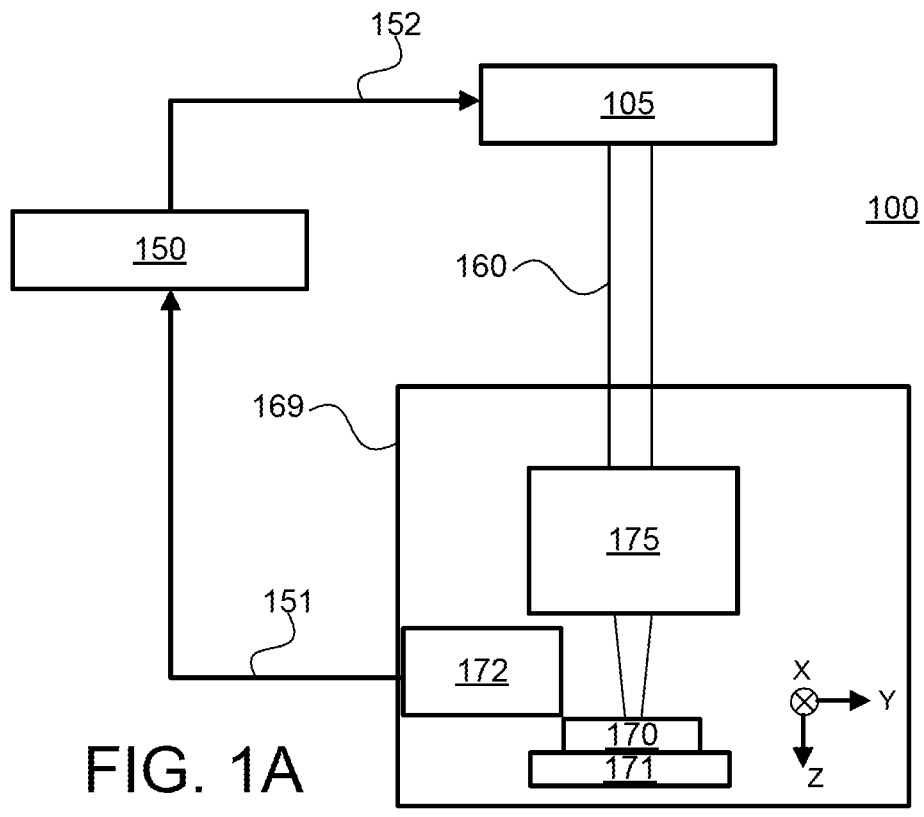
FIG. 1A is a block diagram of an example of an implementation of a photolithography system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

Before describing such embodiments in more detail, however, it is instructive to describe an example environment in which embodiments of the present invention may be implemented. In the description that follows and in the claims the terms "up," "down," "top," "bottom," "vertical," "horizontal," and like terms may be employed. These terms are intended to show relative orientation only and not necessarily any orientation with respect to gravity unless otherwise indicated.

Referring to FIG. 1A, a photolithography system 100 includes an optical (or light) source 105 that provides a light beam 160 to a lithography exposure apparatus 169, which processes a wafer 170 received by a wafer holder or stage 171. The light beam 160 is a pulsed light beam that includes pulses of light separated from each other in time. The lithography exposure apparatus 169 includes a projection optical system 175 through which the light beam 160 passes prior to reaching the wafer 170, and a metrology system 172. The metrology system 172 may include, for example, a camera or other device that is able to capture an image of the wafer 170 and/or the light beam 160 at the wafer 170, or an optical detector that is able to capture data that describes characteristics of the light beam 160, such as intensity of the light beam 160 at the wafer 170 in the x-y plane. The lithography exposure apparatus 169 can be a liquid immersion system or a dry system. The photolithography system 100 also may include a control system 150 to control the light source 105 and/or the lithography exposure apparatus 169.

Figure 1B:
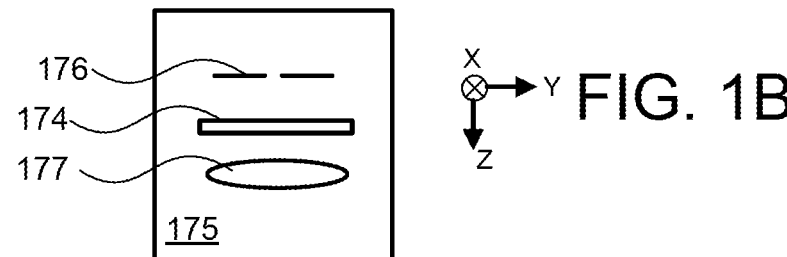
FIG. 1B is a block diagram of an example of an implementation of an optical system for the photolithography system of FIG. 1A.

Microelectronic features are formed on the wafer 170 by, for example, exposing a layer of radiation-sensitive photoresist material on the wafer 170 with the light beam 160. Referring also to FIG. 1B, the projection optical system 175 includes a slit 176, a mask 174, and a projection objective, which includes a lens 177. The light beam 160 enters the optical system 175 and impinges on the slit 176, and at least some of the beam 160 passes through the slit 176. In the example of FIGS. 1A and 1B, the slit 176 is rectangular and shapes the light beam 160 into an elongated rectangular shaped light beam. A pattern is formed on the mask 174, and the pattern determines which portions of the shaped light beam are transmitted by the mask 174 and which are blocked by the mask 174. The design of the pattern is determined by the specific microelectronic circuit design that is to be formed on the wafer 170.

The shaped light beam interacts with the mask 174. The portions of the shaped light beam that are transmitted by the mask 174 pass through (and may be focused by) the projection lens 177 and expose the wafer 170. The portions of the shaped light beam that are transmitted by the mask 174 form an aerial image in the x-y plane in the wafer 170. The aerial image is the intensity pattern formed by the light that reaches the wafer 170 after interacting with the mask 174. The aerial image is at the wafer 170 and extends generally in the x-y plane.

Figure 1C:
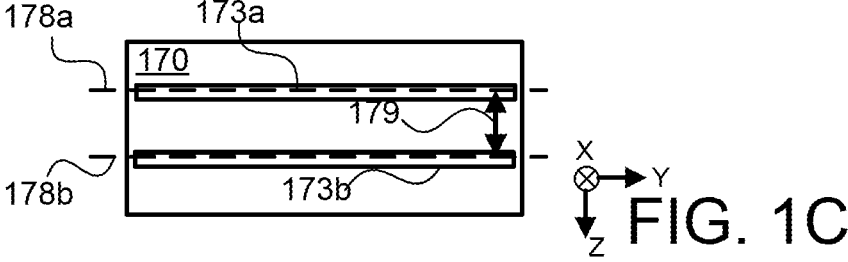
FIG. 1C is a cross-sectional view of an example of a wafer exposed by the photolithography system of FIG. 1A.

The system 100 is able to form a plurality of aerial images during a single exposure pass, with each of the aerial images being at a spatially distinct location along the z axis in the wafer 170. Referring also to FIG. 1C, which shows a cross-sectional view of the wafer 170 in the y-z plane, the projection optical system 175 forms two aerial images 173a, 173b at different planes along the z axis in a single exposure pass. As discussed in greater detail below, each of the aerial images 173a, 173b is formed from light having a different primary wavelength.

The location of the aerial image along the z axis depends on the characteristics of the optical system 175 (including the projection lens 177 and the mask 174) and the wavelength of the light beam 160. The focal position of the lens 177 depends on the wavelength of the light incident on the lens 177. Thus, varying or otherwise controlling the wavelength of the light beam 160 allows the position of the aerial image to be controlled. By providing pulses having different primary wavelengths of light during a single exposure pass, a plurality (two or more) of aerial images, which are each at a different location along the z axis, may be formed in a single exposure pass without moving the optical system 175 (or any components of the optical system 175) and the wafer 170 relative to each other along the z axis.

In the example of FIG. 1A, light passing through the mask 174 is focused to a focal plane by the projection lens 177. The focal plane of the projection lens 177 is between the projection lens 177 and the wafer stage 171, with the position of the focal plane along the z axis depending on the properties of the optical system 175 and the wavelength of the light beam 160. The aerial images 173a, 173b are formed from light having different wavelengths, thus the aerial images 173a, 173b are at different locations in the wafer 170. The aerial images 173a, 173b are separated from each other along the z axis by a separation distance 179. The separation distance 179 depends on the difference between the wavelength of the light that forms the aerial image 173a and the wavelength of the light that forms the aerial image 173b.

The separation distance 179 is formed due to the ability to control the primary wavelengths in the pulses that pass through the mask 174 during the exposure pass. Moreover, the aerial images 173a and 173b are both present at the wafer 170 during the same exposure pass. In other words, the system 100 does not require that the aerial image 173a be formed in a first exposure pass and the aerial image 173b be formed in a second, subsequent exposure pass.

The light in the first aerial image 173a interacts with the wafer at a portion 178a, and the light in the second aerial image 173b interacts with the wafer at a portion 178b. These interactions may form electronic features or other physical characteristics, such as openings or holes, on the wafer 170. Because the aerial images 173a, 173b are at different planes along the z axis, the aerial images 173a, 173b may be used to form three-dimensional features on the wafer 170. For example, the aerial image 173a may be used to form a periphery region, and the aerial image 173b may be used to form a channel, trench, or recess that is at a different location along the z axis. As such, the techniques discussed herein may be used to form a three-dimensional semiconductor component, such as a three-dimensional NAND flash memory component.

Before discussing additional details related to forming multiple aerial images in a single exposure pass, example implementations of the light source 105 and the photolithography system 100 are discussed with respect to FIGS. 2A-2C, 3A-3C, and 4.

Figure 2A:
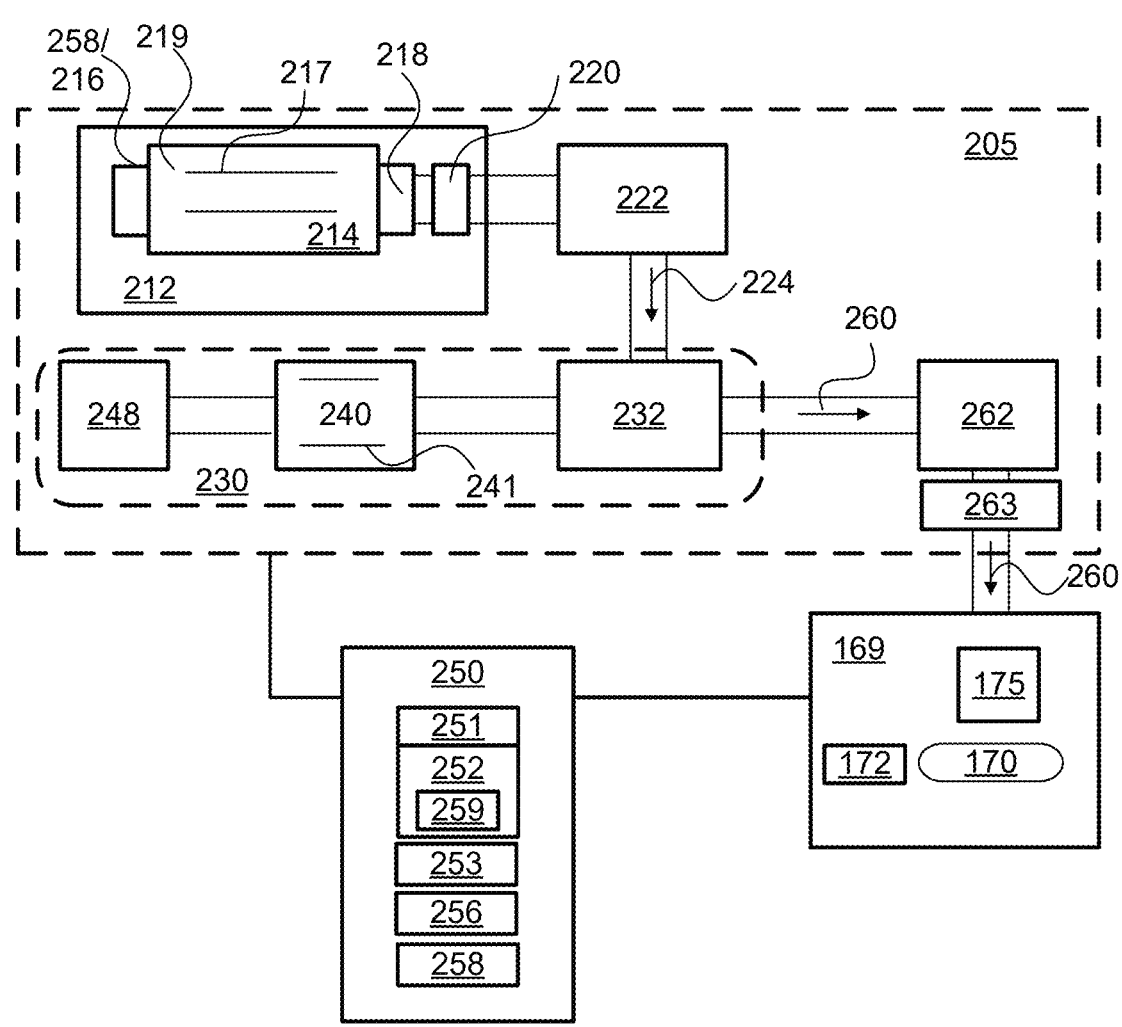
FIG. 2A is a block diagram of another example of an implementation of a photolithography system.

Referring to FIG. 2A, a block diagram of a photolithography system 200 is shown. The system 200 is an example of an implementation of the system 100 (FIG. 1A). For example, in the photolithography system 200, an optical source 205 is used as the optical source 105 (FIG. 1A). The optical source 205 produces a pulsed light beam 260, which is provided to the lithography exposure apparatus 169. The optical source 205 may be, for example, an excimer optical source that outputs the pulsed light beam 260 (which may be a laser beam). As the pulsed light beam 260 enters the lithography exposure apparatus 169, it is directed through the projection optical system 175 and projected onto the wafer 170. In this way, one or more microelectronic features are patterned onto a photoresist on the wafer 170 that is then developed and cleaned prior to subsequent process steps, and the process repeats. The photolithography system 200 also includes the control system 250, which, in the example of FIG. 2A, is connected to components of the optical source 205 as well as to the lithography exposure apparatus 169 to control various operations of the system 200. The control system 250 is an example of an implementation of the control system 250 of FIG. 1A.

In the example shown in FIG. 2A, the optical source 205 is a two-stage laser system that includes a master oscillator (MO) 212 that provides a seed light beam 224 to a power amplifier (PA) 230. The MO 212 and the PA 230 may be considered to be subsystems of the optical source 205 or systems that are part of the optical source 205. The power amplifier 230 receives the seed light beam 224 from the master oscillator 212 and amplifies the seed light beam 224 to generate the light beam 260 for use in the lithography exposure apparatus 169. For example, the master oscillator 212 may emit a pulsed seed light beam, with seed pulse energies of approximately 1 milliJoule (mJ) per pulse, and these seed pulses may be amplified by the power amplifier 230 to about 10 to 15 mJ.

Figure 2B:
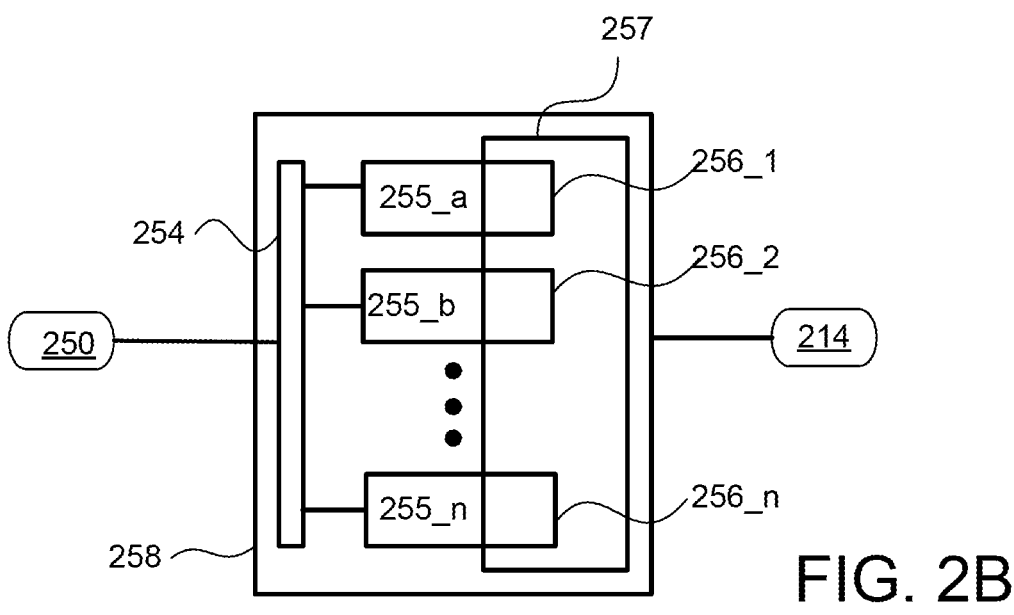
FIG. 2B is a block diagram of an example of an implementation of a spectral feature selection module that may be used in a photolithography system.
Figure 2C:
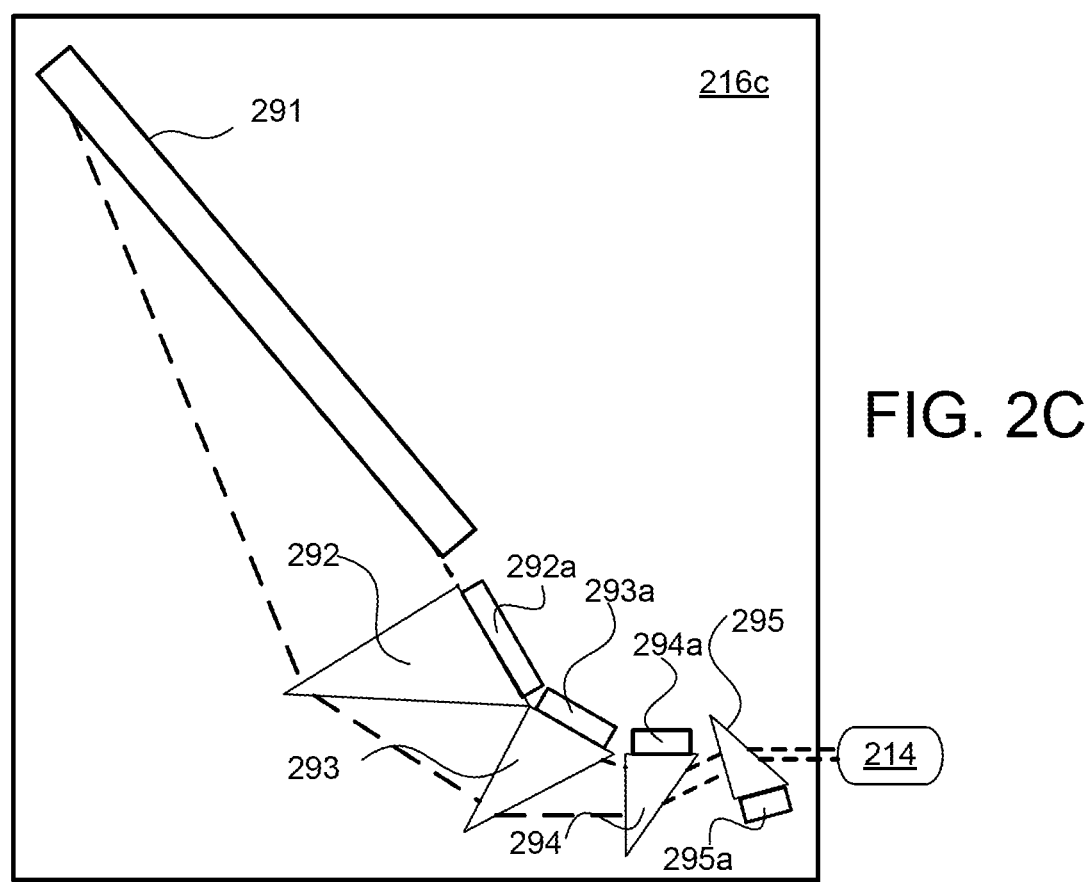
FIG. 2C is a block diagram of an example of an implementation of a line narrowing module.

The master oscillator 212 includes a discharge chamber 240 having two elongated electrodes 217, a gain medium 219 that is a gas mixture, and a fan for circulating gas between the electrodes 217. A resonator is formed between a line narrowing module 216 on one side of the discharge chamber 240 and an output coupler 218 on a second side of the discharge chamber 240. The line narrowing module 216 may include a diffractive optic such as a grating that finely tunes the spectral output of the discharge chamber 240. FIGS. 2B and 2C provide additional detail about the line narrowing module 216.

FIG. 2B is a block diagram of an example of an implementation of a spectral feature selection module 258 that includes one or more instances of the line narrowing module 216. The spectral feature selection module 258 couples to light that propagates in the optical source 205. In some implementations (such as shown in FIG. 2B), the spectral feature selection module 258 receives the light from the chamber 214 of the master oscillator 212 to enable the fine tuning of the spectral features such as wavelength and bandwidth within the master oscillator 212.

The spectral feature selection module 258 may include a control module such as a spectral feature control module 254 that includes electronics in the form of any combination of firmware and software. The control module 254 is connected to one or more actuation systems such as spectral feature actuation systems 255_1 to 255_n. Each of the actuation systems 255_1 to 255_n may include one or more actuators that are connected to respective optical features 256_1 to 256_n of an optical system 257. The optical features 256_1 to 256_n are configured to adjust particular characteristics of the generated light beam 260 to thereby adjust the spectral features of the light beam 260. The control module 254 receives a control signal from the control system 250, the control signal including specific commands to operate or control one or more of the actuation systems 255_1 to 255_n. The actuation systems 255_1 to 255_n can be selected and designed to work together, that is, in tandem, or the actuation system 255_1 to 255_n may be configured to work individually. Moreover, each actuation system 255_1 to 255_n may be optimized to respond to a particular class of disturbances.

Each optical feature 256_1 to 256_n is optically coupled to the light beam 260 produced by the optical source 105. The optical system 257 may be implemented as a line narrowing module 216c such as that shown in FIG. 2C. The line narrowing module includes as the optical features 256_1 to 256_n dispersive optical elements such as a reflective gratings 291 and refractive optical elements such as prisms 292, 293, 294, and 295. One or more of the prisms 292, 293, 294, and 295 may be rotatable. An example of this line narrowing module can be found in U.S. Pat. No. 8,144,739, titled "System Method and Apparatus for Selecting and Controlling Light Source Bandwidth", issued Mar. 27, 2012 (the '739 patent). In the '739 patent, a line narrowing module is described that includes a beam expander (including the one or more prisms 292, 293, 294, and 295) and a dispersive element such as the grating 291.

All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls.

Each of the actuators of the actuation systems 255_1 to 255_n is an EAE for moving or controlling the respective optical features 256_1 to 256_n of the optical system 257. The actuators receive energy from the module 254 and convert that energy into some kind of motion imparted to the optical features 256_1 to 256_n of the optical system 257. For example, in the '306 application, actuation systems are described such as force devices (to apply forces to regions of the grating) and rotation stages for rotating one or more of the prisms of the beam expander.

The respective actuation systems for the optical features such as one or more of the prisms 292, 293, 294, and 295 are represented in FIG. 2C by EAEs 292a, 293a, 294a, and 295a, respectively. A mirror may also be present and rotated to change the angle of incidence of the light beam on the grating 291 and so the primary wavelength of the emitted light. The common element is that there is an EAE that causes the motion under the command of a voltage command signal. Thus, in general, the line narrowing module includes one or more optical elements that are rotated to change the primary wavelength of the light leaving the module. These EAEs must be able to move the optical elements very rapidly between two positions, usually two angular positions, in a process referred to as dithering.

Returning to FIG. 2A, the master oscillator 212 also includes a line center analysis module 220 that receives an output light beam from the output coupler 218 and a beam coupling optical system 222 that modifies the size or shape of the output light beam as needed to form the seed light beam 224. The line center analysis module 220 is a measurement system that may be used to measure or monitor the wavelength of the seed light beam 224. The line center analysis module 220 may be placed at other locations in the optical source 205, or it may be placed at the output of the optical source 205.

The gas mixture used in the discharge chamber 214 may be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 217.

The power amplifier 230 includes a beam coupling optical system 232 that receives the seed light beam 224 from the master oscillator 212 and directs the light beam through a discharge chamber 240, and to a beam turning optical element 248, which modifies or changes the direction of the seed light beam 224 so that it is sent back into the discharge chamber 240. The discharge chamber 240 includes a pair of elongated electrodes 241, a gain medium that is a gas mixture, and a fan for circulating the gas mixture between the electrodes 241.

The output light beam 260 is directed through a bandwidth analysis module 262, where various parameters (such as the bandwidth or the wavelength) of the beam 260 may be measured. The output light beam 260 may also be directed through a beam preparation system 263. The beam preparation system 263 may include, for example, a pulse stretcher, where each of the pulses of the output light beam 260 is stretched in time, for example, in an optical delay unit, to adjust for performance properties of the light beam that impinges on the lithography exposure apparatus 169. The beam preparation system 263 also may include other components that are able to act upon the beam 260 such as, for example, reflective and/or refractive optical elements (such as, for example, lenses and mirrors), filters, and optical apertures (including automated shutters).

The photolithography system 200 also includes the control system 250. In the implementation shown in FIG. 2A, the control system 250 is connected to various components of the optical source 205. For example, the control system 250 may control when the optical source 205 emits a pulse of light or a burst of light pulses that includes one or more pulses of light by sending one or more trigger signals to the optical source 205. The control system 250 is also connected to the lithography exposure apparatus 169. Thus, the control system 250 also may control the various aspects of the lithography exposure apparatus 169. For example, the control system 250 may control the exposure of the wafer 170 and thus may be used to control how electronic features are printed on the wafer 170. In some implementations, the control system 250 may control the scanning of the wafer 170 by controlling the motion of the slit 176 in the x-y plane (FIG. 1B). Moreover, the control system 250 may exchange data with the metrology system 172 and/or the optical system 175.

The lithography exposure apparatus 169 also may include, for example, temperature control devices (such as air conditioning devices and/or heating devices), and/or power supplies for the various electrical components. The control system 250 also may control these components. In some implementations, the control system 250 is implemented to include more than one sub-control system, with at least one sub-control system (a lithography controller) dedicated to controlling aspects of the lithography exposure apparatus 169. In these implementations, the control system 250 may be used to control aspects of the lithography exposure apparatus 169 instead of, or in addition to, using the lithography controller.

The control system 250 includes an electronic processor 251, an electronic storage 252, and an I/O interface 253. The electronic processor 251 includes one or more processors suitable for the execution of a computer program such as a general or special purpose microprocessor, and any one or more processors of any kind of digital computer. Generally, an electronic processor receives instructions and data from a read-only memory, a random access memory, or both. The electronic processor 251 may be any type of electronic processor.

The electronic storage 252 may be volatile memory, such as RAM, or non-volatile memory. In some implementations, the electronic storage 252 includes non-volatile and volatile portions or components. The electronic storage 252 may store data and information that is used in the operation of the control system 250, components of the control system 250, and/or systems controlled by the control system 250. The information may be stored in, for example, a look-up table or a database. For example, the electronic storage 252 may store data that indicates values of various properties of the beam 260 under different operating conditions and performance scenarios.

Moreover, the electronic storage 252 may store various recipes or process programs 259 that dictate parameters of the light beam 260 during use. For example, the electronic storage 252 may store a recipe that indicates the wavelength of each pulse in the light beam 260 for a particular exposure pass. The recipe may indicate different wavelengths for different exposure passes. The wavelength controlling techniques discussed below may be applied on a pulse-by-pulse basis. In other words, the wavelength content may be controlled for each individual pulse in an exposure pass to facilitate formation of the aerial images at the desired locations along the z axis.

The electronic storage 252 also may store instructions, perhaps as a computer program, that, when executed, cause the processor 251 to communicate with components in the control system 250, the optical system 205, and/or the lithography exposure apparatus 169. The control system 250 also includes a trigger signal generator 256 for generating the trigger signals described below and a pulse counter 258 for counting pulses as described below.

The I/O interface 253 is any kind of electronic interface that allows the control system 250 to receive and/or provide data and signals with an operator, the optical system 205, the lithography exposure apparatus 169, any component or system within the optical system 205 and/or the lithography exposure apparatus 169, and/or an automated process running on another electronic device. For example, the I/O interface 253 may include one or more of a visual display, a keyboard, and a communications interface.

The light beam 260 (and the light beam 160) are pulsed light beams and may include one or more bursts of pulses that are separated from each other in time. Each burst may include one or more pulses of light. In some implementations, a burst includes hundreds of pulses, for example, 100-400 pulses. FIGS. 3A-3C provides an overview of the production of pulses and bursts in the optical source 205. FIG. 3A shows an amplitude of a wafer exposure signal 300 as a function of time, FIG. 3B shows an amplitude of a gate signal 315 as a function of time, and FIG. 3C shows an amplitude of a trigger signal as a function of time.

The control system 250 may be configured to send the wafer exposure signal 300 to the optical source 205 to control the optical source 205 to produce the light beam 260. In the example shown in FIG. 3A, the wafer exposure signal 300 has a high value 305 (for example, 1) for a period of time 307 during which the optical source 205 produces bursts of pulses of light. The wafer exposure signal 300 otherwise has a low value 310 (for example, 0) when the wafer 170 is not being exposed.

Referring to FIG. 3B, the light beam 260 is a pulsed light beam, and the light beam 260 includes bursts of pulses. The control system 250 also controls the duration and frequency of the bursts of pulses by sending a gate signal 315 to the optical source 205. The gate signal 315 has a high value 320 (for example, 1) during a burst of pulses and a low value 325 (for example, 0) during the time between successive bursts. In the example shown, the duration of time at which the gate signal 315 has the high value is also the duration of a burst 316. The bursts are separated in time by an inter-burst time interval. During the inter-burst time interval, the lithography exposure apparatus 169 may position the next die on the wafer 170 for exposure.

Referring to FIG. 3C, the control system 250 also controls the repetition rate of the pulses within each burst with a trigger signal 330. The trigger signal 330 includes triggers 340 that are provided to the optical source 205 to cause the optical source 205 to produce pulses of light. The control system 250 may send a trigger 340 to the source 205 each time a pulse is to be produced. Thus, the repetition rate of the pulses produced by the optical source 205 (the time between two successive pulses), or other timing of the pules, may be set by the trigger signal 330.

As discussed above, when the gain medium 219 is pumped by applying voltage to the electrodes 217, the gain medium 219 emits light. When voltage is applied to the electrodes 217 in pulses, the light emitted from the medium 219 is also pulsed. Thus, the repetition rate of the pulsed light beam 260 is determined by the rate at which voltage is applied to the electrodes 217, with each application of voltage producing a pulse of light. The pulse of light propagates through the gain medium 219 and exits the chamber 214 through the output coupler 218. Thus, a train of pulses is created by periodic, repeated application of voltage to the electrodes 217. The trigger signal 330, for example, may be used to control the application of voltage to the electrodes 217 and the repetition rate of the pulses, which may range between about 500 and 6,000 Hz for most applications. In some implementations, the repetition rate may be greater than 6,000 Hz, and may be, for example, 12,000 Hz or greater The signals from the control system 250 may also be used to control the electrodes 217, 241 within the master oscillator 212 and the power amplifier 230, respectively, for controlling the respective pulse energies of the master oscillator 212 and the power amplifier 230, and thus, the energy of the light beam 260. There may be a delay between the signal provided to the electrodes 217 and the signal provided to the electrodes 241. The amount of delay may influence properties of the beam 260, such as the amount of coherence in the pulsed light beam 260.

The pulsed light beam 260 may have an average output power in the range of tens of watts, for example, from about 50 W to about 130 W. The irradiance (that is, the average power per unit area) of the light beam 260 at the output may range from 60 W/cm2 to 80 W/cm2.

Figure 4:
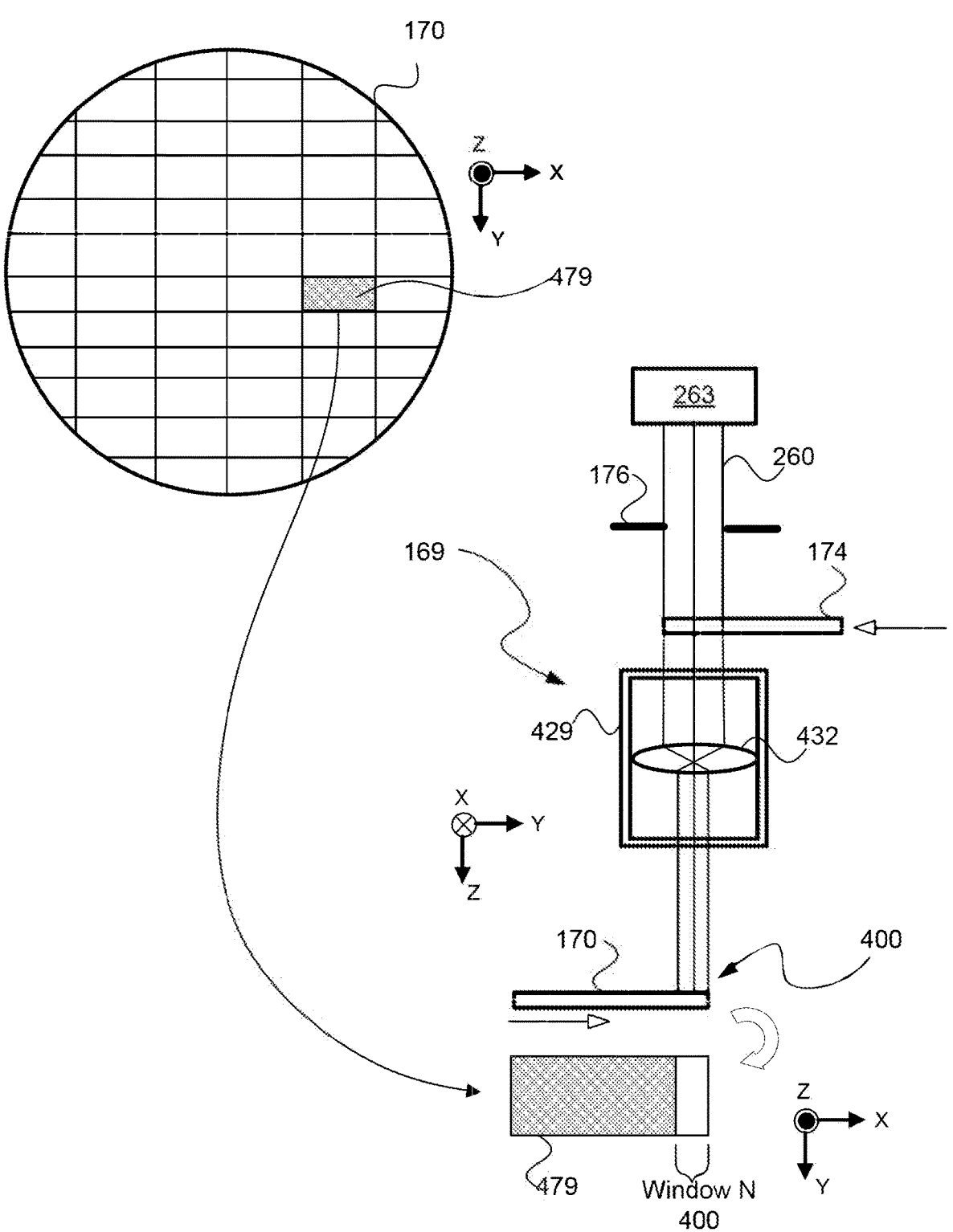
FIG. 4 is a block diagram of another example of an implementation of a photolithography system.

Referring also to FIG. 4, the wafer 170 is irradiated by the light beam 260. The lithography exposure apparatus 169 includes the optical system 175 (FIGS. 1A and 1B). In the example of FIG. 4, the optical system 175 (not shown) includes an illuminator system 429, which includes an objective arrangement 432. The objective arrangement 432 includes the projection lens 177 (FIG. 1B) and enables the image transfer to occur from the mask 174 to the photoresist on the wafer 170. The illuminator system 429 adjusts the range of angles for the light beam 260 impinging on the mask 174. The illuminator system 429 also may homogenize (make uniform) the intensity distribution of the light beam 260 in the x-y plane across the mask 174.

In some implementations, an immersion medium may be supplied to cover the wafer 170. The immersion medium may be a liquid (such as water) for liquid immersion lithography. In other implementations in which the lithography is a dry system, the immersion medium may be a gas such as dry nitrogen, dry air, or clean air. In other implementations, the wafer 170 may be exposed within a pressure-controlled environment (such as a vacuum or partial vacuum).

During an exposure pass, a plurality of N pulses of the light beam 260 illuminates the same area of the wafer 170. N may be any integer number greater than one. The number of pulses N of the light beam 110 that illuminate the same area may be referred to as an exposure window or exposure pass 400. The size of the window 400 may be controlled by the slit 176. For example, the slit 176 may include a plurality of blades that are movable such that the blades form an open aperture in one configuration and close the aperture in another configuration. By arranging the blades of the slit 176 to form an aperture of a particular size, the size of the window 400 also may be controlled.

The N pulses also determine an illumination dose for the exposure pass. The illumination dose is the amount of optical energy that is delivered to the wafer during the exposure pass. Thus, properties of the N pulses, such as the optical energy in each pulse, determine the illumination dose. Moreover, and as discussed in greater detail below, the N pulses also may be used to determine the amount of light in each of the aerial images 173a, 173b. In particular, a recipe may specify that of the N pulses, a certain number of pulses have a first primary wavelength that forms the aerial image 173a and a certain number of pulses have a second primary wavelength that forms the aerial image 173b. These pulses, which will have wavelengths that differ from each other, may be interspersed, for example, pulse-to-pulse or in some other manner, i.e., in alternating groups of pulses.

Additionally, the slit 176 and/or the mask 174 may move in a scanning direction in the x-y plane such that only a portion of the wafer 170 is exposed at a given time or during a particular exposure scan (or exposure pass). The size of the area on the wafer 170 exposed by the light beam 160 is determined by the distance between the blades in the non-scanning direction and by the length (distance) of the scan in the scanning direction. In some implementations, the value of N is in the tens, for example, each point on the wafer may receive light from 10-100 consecutive pulses during the scanning of the slit relative to that point. In other implementations, the value of N is greater than 100 pulses, for example, from 100-500 pulses. An exposure field 479 of the wafer 170 is the physical area of the wafer 170 that is exposed in one scan of an exposure slit or window within the lithography exposure apparatus 169.

The wafer stage 171, the mask 174, and the objective arrangement 432 are fixed to associated actuation systems to thereby form a scanning arrangement. In the scanning arrangement, one or more of the mask 174, the objective arrangement 432, and the wafer 170 (via the stage 171) may move relative to each other in the x-y plane. However, aside from incidental relative operational motion between the wafer stage 171, the mask 174, and the objective arrangement 432, these elements are not moved relative to each other along the z axis during an exposure pass or an exposure pass.

Figure 5:
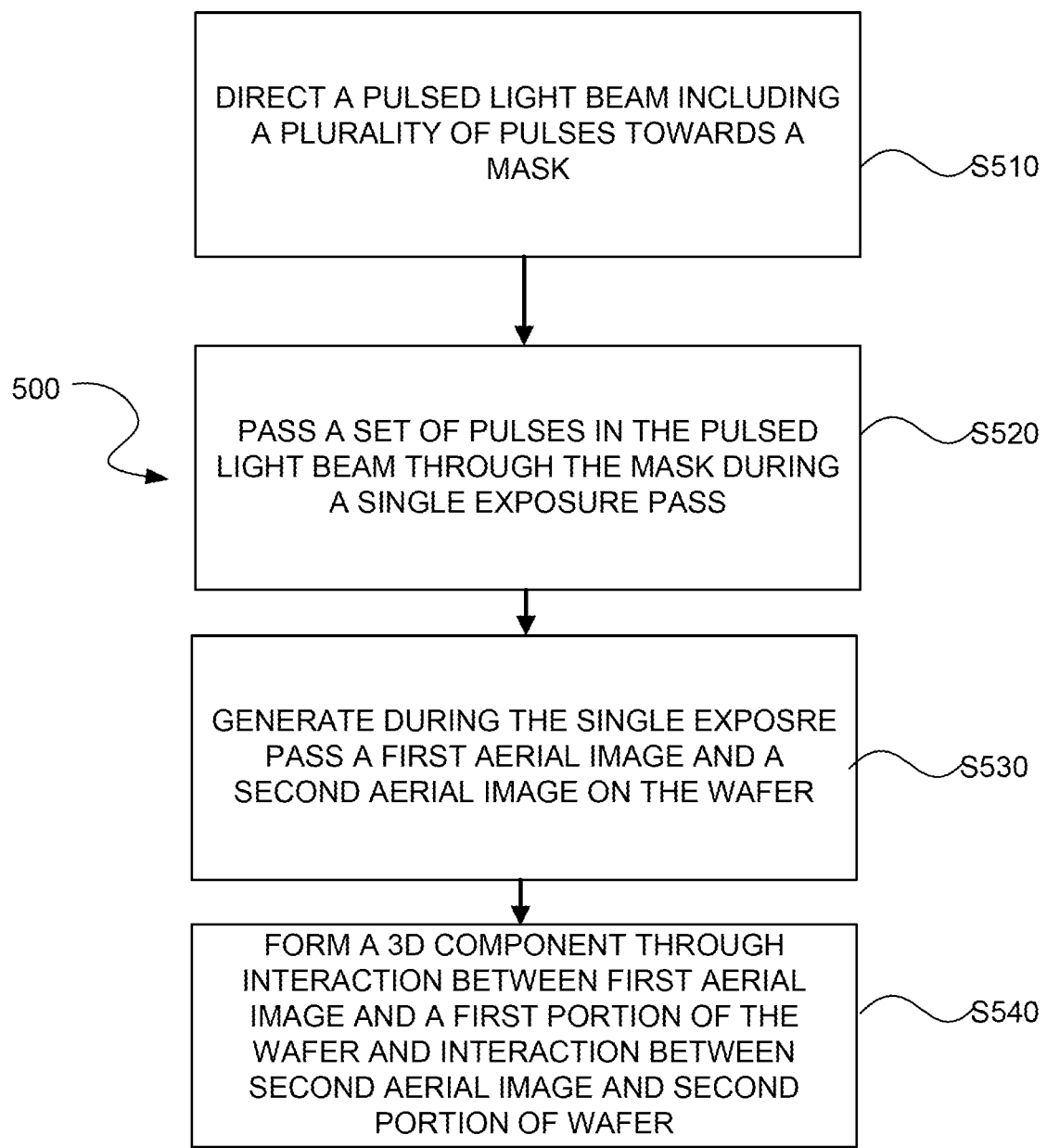
FIG. 5 is a flowchart of an example of a process for forming a three-dimensional semiconductor component.

Referring to FIG. 5, a flowchart of a process 500 is shown. The process 500 is an example of a process for forming a three-dimensional semiconductor component or a portion of such a component. The process 500 may be performed using the photolithography system 100 or 200. The process 500 is discussed with respect to the system 200 shown in FIG. 2A. The process 500 is also discussed with respect to FIGS. 6A-10B.

Figure 6A:
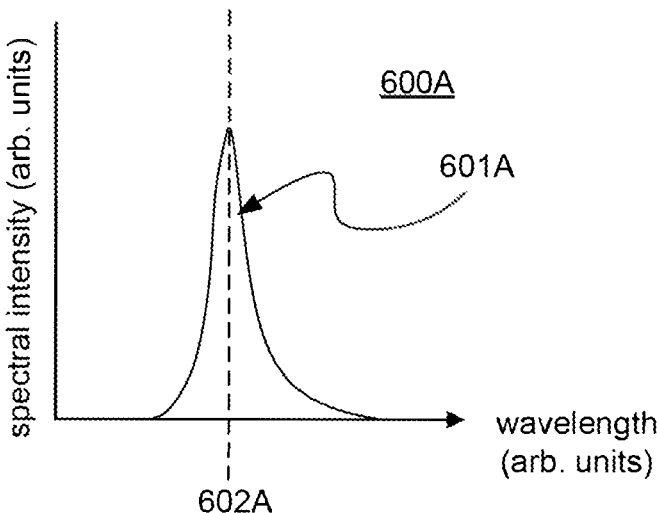
FIGS. 6A and 6B each show an example of an optical spectrum of a single pulse of light.
Figure 6B:
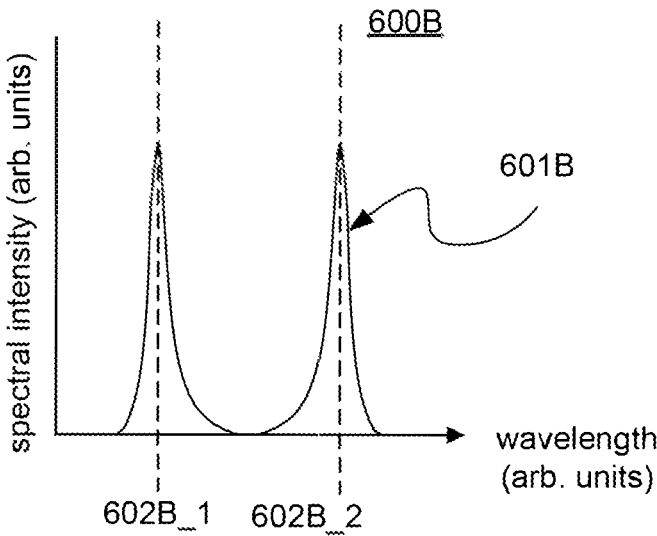

The light beam 260 is directed toward the mask 174 in a step S510. The light beam 260 is a pulsed light beam that includes a plurality of pulses, each of which are separated from each other in time such as shown in FIG. 3C. FIGS. 6A and 6B show examples of optical spectra of a single pulse that is part of the light beam 260. Other pulses in the light beam 260 may have different optical spectra.

Referring to FIG. 6A, an optical spectrum 601A of a pulse of light 600A is shown. The pulse of light 600A has non-zero intensity within a band of wavelengths. The band of wavelengths also may be referred to as the bandwidth of the pulse 600A.

The information shown in FIG. 6A is the instantaneous optical spectrum 601A (or emission spectrum) of the pulse 600A. The optical spectrum 601A contains information about how the optical energy or power of a pulse of the light beam 260 is distributed over different wavelengths (or frequencies). The optical spectrum 601 A is depicted in the form of a diagram where the spectral intensity (not necessarily with an absolute calibration) is plotted as a function of the wavelength or optical frequency. The optical spectrum 601A may be referred to as the spectral shape or intensity spectrum of a pulse of the light beam 260. The pulse 600A has a primary wavelength 602A, which, in the example of FIG. 6A, is the peak intensity. Although the discussion of the pulses of the light beam 260 and the aerial images formed by the pulses of the light beam 260 refers to the primary wavelengths of the pulses, the pulses include wavelengths other than the primary wavelength and the pulses have a finite bandwidth that may be characterized by a metric. For example, the full width of the spectrum 601A at a fraction (X) of the maximum peak intensity of the spectral shape (referred to as FWXM) may be used to characterize the light beam bandwidth. As another example, the width of the spectrum that contains a fraction (Y) of the integrated spectral intensity (referred to as EY) may be used to characterize the light beam bandwidth.

The pulse 600A is shown as an example of a pulse that may be in the light beam 260.

When the pulse 600A is used to expose a portion of the wafer 120, the light in the pulse forms an aerial image. The location of the aerial image in the z direction (FIGS. 1C and 4) is determined by the value of the primary wavelength 602A. The various pulses in the light beam 260 may have different primary wavelengths. For example, to generate two aerial images during a single exposure pass, some of the pulses of the light beam 260 have one primary wavelength (a first primary wavelength) and the other pulses of the light beam 260 have another primary wavelength (a second primary wavelength). The first and second primary wavelengths are different wavelengths. The wavelength difference between the first and second primary wavelengths may be referred to as the spectral separation. Although the wavelengths of the various pulses in the light beam 260 may be different, the shape of the optical spectra of the pulses may be the same.

The light source 205 may dither or switch the primary wavelength between the first and second primary wavelengths on a burst-to-burst, pulse-to-pulse, or intrapulse basis. For the pulse-to-pulse case each pulse has a different primary wavelength than a pulse that immediately precedes or follows the pulse in time. In these implementations, assuming that all of the pulses in the light beam 260 have the same intensity, distributing the first and second primary wavelengths in this manner results in two aerial images at different locations in the z direction with the same intensity.

In some implementations, a certain portion (for example, 33%) of the pulses have the first primary wavelength, and the remainder (67% in this example) have the second primary wavelength. In these implementations, assuming that all of the pulses in the light beam 260 have the same intensity, two aerial images are formed of different intensities. The aerial image formed by the pulses having the first primary wavelength has about half of the intensity of the aerial image formed by the pulses having the second primary wavelength. In this way, the dose provided to a particular location in the wafer 170 along the z axis may be controlled by controlling the portion of the N pulses that have the first primary wavelength and the portion of the N pulses that have the second primary wavelength.

The portion of pulses that are to have a particular primary wavelength for an exposure pass may be specified in a recipe file 259 that is stored in the electronic storage 252 (see FIG. 2A). The recipe file 259 specifies the ratio of the various primary wavelengths for an exposure pass. The recipe file 259 also may specify the ratio for other exposure passes, such that a different ratio may be used for other exposure passes and the aerial images may be adjusted or controlled on a field-by-field basis.

Referring to FIG. 6B, an optical spectrum 601B of a pulse 600B is shown. The pulse 600B is another example of a pulse of the light beam 260. The optical spectrum 601B of the pulse 600B has a different shape than the optical spectrum 601A. In particular, the optical spectrum 601B has two peaks that correspond to two primary wavelengths 602B_1 and 602B_2 of the pulse 600B. The pulse 600B is part of the light beam 260. When the pulse 600B is used to expose a portion of the wafer 120, the light in the pulse forms two aerial images at different locations along the z axis on the wafer. The locations of the aerial images are determined by the wavelengths of the primary wavelengths 602B_1 and 602B_2.

The pulses shown in FIGS. 6A and 6B may be formed by any hardware capable of forming such pulses. For example, a pulse train of pulses such as the pulse 600A may be formed using a line narrowing module similar to the line narrowing module 216C of FIG. 2C. The wavelength of the light diffracted by the grating 291 depends on the angle of the light that is incident on the grating. A mechanism to change the angle of incidence of light that interacts with the grating 291 may be used with such a line narrowing module to create a pulse train with N pulses for an exposure pass, where at least one of the N pulses has a primary wavelength that is different from the primary wavelength of another pulse of the N pulses. For example, one of the prisms 292, 293, 294, and 295 may be rotated to change the angle of light that is incident on the grating 291 on a pulse-by-pulse basis. In some implementations, the line narrowing module includes a mirror that is in the path of the beam 260 and is movable to change the angle of light that is incident on the grating 291. An example of such an implementation is discussed, for example, in U.S. Pat. No. 6,192,064, titled "Narrow Band Laser with Fine Wavelength Control", issued on Feb. 20, 2001.

Figure 7:
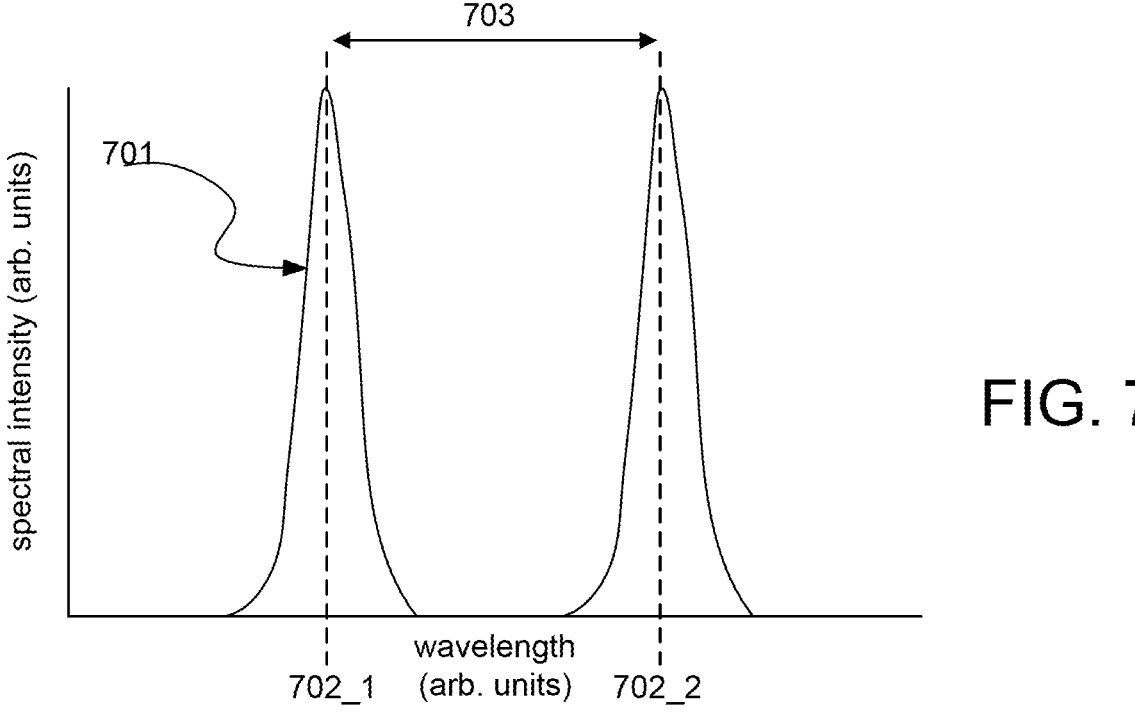
FIG. 7 shows an example of an average optical spectrum for a single exposure pass.

Referring again to FIG. 5, a set of pulses of light is passed through the mask 174 toward the wafer 170 during a single exposure pass in a step S520. As discussed above, N pulses of light may be provided to the wafer 170 during the exposure pass. The N pulses of light may be consecutive pulses of light in the beam 260. The exposed portion of the wafer 170 sees an average of the optical spectrum of each of the N pulses over the exposure pass. Thus, if a portion of the N pulses have a first primary wavelength and the remaining portion of the N pulses have a second primary wavelength, the average optical spectrum at the wafer 170 will be an optical spectrum that includes a peak at the first primary wavelength and a peak at the second primary wavelength. Similarly, if all or some of the individual pulses of the N pulses have more than one primary wavelength, those primary wavelengths may form peaks in the average optical spectrum. FIG. 7 shows an example of an average optical spectrum 701 at the wafer 170. The averaged optical spectrum 701 includes a first primary wavelength 702_1 and a second primary wavelength 702_2. In the example of FIG. 7, the first primary wavelength 702_1 and the second primary wavelength 702_2 are separated by a spectral separation 703 however other combinations can also be considered. The spectral separation 703 is such that the first primary wavelength 702_1 and the second primary wavelength 702_2 are distinct, and the average optical spectrum 701 includes a spectral region of little to no intensity between the wavelengths 702_1 and 702_2.

Two or more aerial images, for example, the first based on the first primary wavelength and the second based on the second primary wavelength, are formed at the wafer 170 based on the average optical spectrum in a step S530. Continuing the example of the averaged optical spectrum 701 and referring also to FIG. 8A, two aerial images 873*a* and 873*b* are formed in a single exposure pass based on the N pulses. The N pulses include pulses that have the first primary wavelength 702_1 and pulses that have the second primary wavelength 702_2. The pulses that have the first primary wavelength 702_1 form the first aerial image 873*a*, and the pulses that have the second primary wavelength 702_2 form the second aerial image 873*b*. The aerial image 873*a* is formed at a first plane 878*a*, and the aerial image 873*b* is formed at a second plane 878*b*. The planes 878*a* and 878*b* are perpendicular to a direction of propagation of the light beam 260 at the wafer 170. The planes 878*a* and 878*b* are separated along the z direction by a separation distance 879.

The separation distance 879 is larger than the depth of focus of the lithography apparatus 169 for an averaged optical spectrum that has a single primary wavelength. The depth of focus may be defined for a dose value (an amount of optical energy provided to the wafer) as the range of focus along the z direction at which that dose provides a feature size that is within an acceptable range of feature sizes for the process that is being applied to the wafer 170. The process 500 is able to increase the depth of focus of the lithography exposure apparatus 169 by providing more than one distinct aerial image at the wafer 170 during a single exposure pass. This is because the plurality of aerial images are each able to expose the wafer at a different location in the z direction with features that are within the acceptable range of feature sizes. In other words, the process 500 is able to provide the lithography exposure apparatus 169 with a greater range of depth of focus during a single exposure pass.

As discussed above, the operator of the lithography exposure apparatus 169 may control various parameters of the exposure process through the recipe file 259. In some implementations, the operator of the lithography exposure apparatus 169 may receive information from a simulation program, and this information may be used to program or otherwise specify the parameters of the recipe file 259. For example, the operator of the lithography exposure apparatus 169 may know that an upcoming lot is not going to require as much depth of focus as previously exposed lot. In this example, the operator may specify a depth of focus and a dose variation to the simulation program, and the simulation program returns the value of the spectral separation 703 to achieve the desired parameters. The operator may then specify the value of the spectral separation 703 for the upcoming lot by programing the recipe file 259 through the I/O interface 253. In some implementations, the operator may use the simulation to determine whether or not a greater depth of focus (such as is possible by exposing the wafer 170 with a plurality of aerial images at distinct planes) is needed for a particular exposure pass. In instances in which the greater depth of focus is not required to form a particular portion of the semiconductor component, the recipe file 259 may be structured so that, for example, the exposure pass used to form that particular portion of the semiconductor component has an averaged optical spectrum that includes a single primary wavelength.

Moreover, the operator and/or simulator may receive information about the formed three-dimensional component as measured by the metrology system 172 or by another sensor. For example, the metrology system 172 may provide data relating to a sidewall angle of the formed 3D semiconductor component and the data may be used to program parameters in the recipe file 259 for a subsequent exposure pass.

Figure 8A:
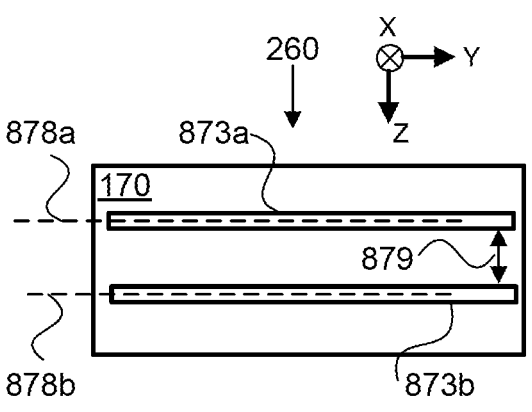
FIGS. 8A and 8B show side and top cross-sectional views, respectively, of an example of a wafer.
Figure 8A:
Figure 8B:
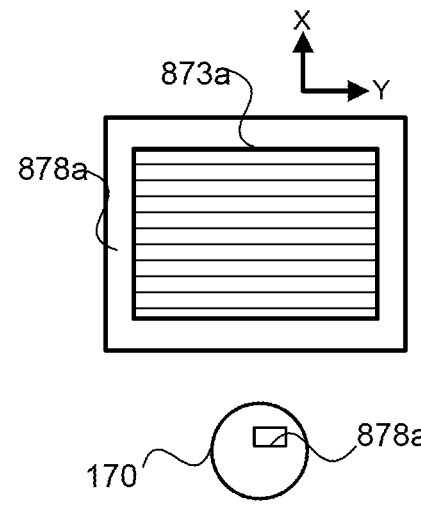

FIG. 8B shows the aerial image 873*a* in the x-y plane (looking into the page in FIG. 8A) at the plane 878*a*. The aerial images 873*a* and 873*b* are generally two-dimensional intensity patterns that are formed in the x-y plane. The nature of the intensity pattern depends on the characteristics of the mask 174. The first and second planes 878*a*, 878*b* are portions of the wafer 170. As illustrated in FIG. 8B, the first plane 878*a* may be only a small portion of the entire wafer 170.

The value of the separation distance 879 depends on the spectral separation 703 and on properties of the optical system 275. For example, the value of the separation distance 879 may depend on the focal length, aberration, and other properties of lenses and other optical elements in the optical system 275. For a scanner lens with a chromatic aberration C, the separation distance 879 may be determined from Equation 1:

$$AD = C * \Delta\lambda, \qquad \text{Equation (1)}$$

where AD is the separation distance 879 in nanometers (nm), C is the chromatic aberration (defined as the distance the focal plane moves in the propagation direction for a wavelength change), and $\Delta\lambda$ is the spectral separation 873 in picometers.

Moreover, due to variations in manufacturing and installation processes and/or modifications made by end users, different primary wavelengths may be required to achieve a desired separation distance 879 for a particular instance of a certain type of exposure apparatus 169. As described above in connection with FIG. 2A, a recipe or process control program file 259 may be stored on the electronic storage 252 of the control system 250. The recipe file 259 may be modified or programmed to be customized to a particular exposure apparatus or a type of exposure apparatus. The recipe file 259 may be programmed when the lithography system 200 is manufactured and/or the recipe file 259 may be programmed via, for example, the I/O interface 253, by an end user or other operator familiar with the performance of the system 200.

The recipe file 259 also may specify a different separation distance 879 for different exposure passes used to expose different areas of the wafer 170. Additionally or alternatively, the recipe file 259 may specify the separation distance 879 on a per-lot or per-layer basis or on a per-wafer basis. A lot or a layer is a group of wafers that are processed by the same exposure apparatus under the same nominal conditions. The recipe file 259 also allows specification of other parameters related to the aerial images 873*a*, 873*b*, such as the dose provided by each image. For example, the recipe file 259 may specify a ratio of the number of pulses in the N pulses that have the first primary wavelength 702_1 to the number of pulses that have the second primary wavelength 702_2. These other parameters also may be specified on a per-field, per-lot (or per-layer), and/or per-wafer basis.

Moreover, the recipe file 259 may specify that some layers are not exposed with the first primary wavelength 702_1 and the second primary wavelength 702_2 and are instead exposed with a pulse that has an optical spectrum that includes a single primary wavelength. Such an optical spectrum may be used, for example, when a planar semiconductor component is to be formed instead of a three-dimensional semiconductor component. The I/O interface 253 allows an end-user and/or manufacturer to program or create the recipe to specify the number of primary wavelengths, including a scenario in which a single primary wavelength is used, for example, for a particular layer or lot.

Additionally, although the example above discusses the average optical spectrum 701 having two primary wavelengths, in other examples, the average optical spectrum 701 may have more than two primary wavelengths (for example, three, four, or five primary wavelengths), each of which are separated from the nearest other primary wavelength by a spectral separation. The I/O interface 253 allows an end-user and/or manufacturer to program or create the recipe to specify these parameters.

Figure 9A:
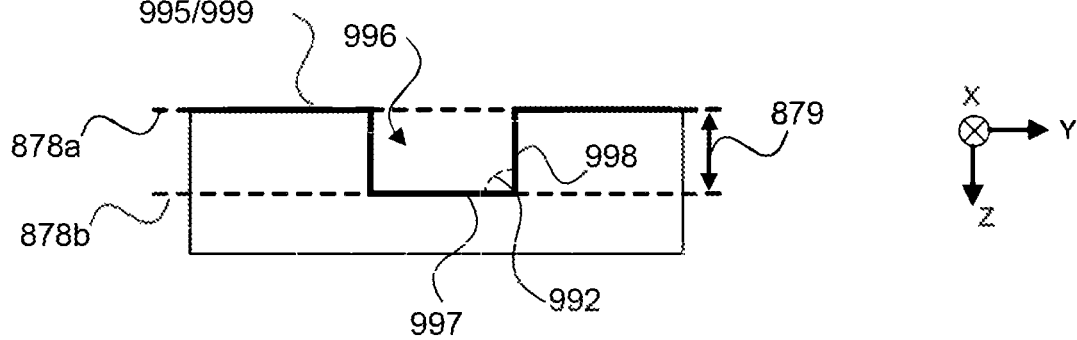
FIGS. 9A and 9B show side and top cross-sectional views, respectively, of an example of a three-dimensional semiconductor component.
Figure 9B:
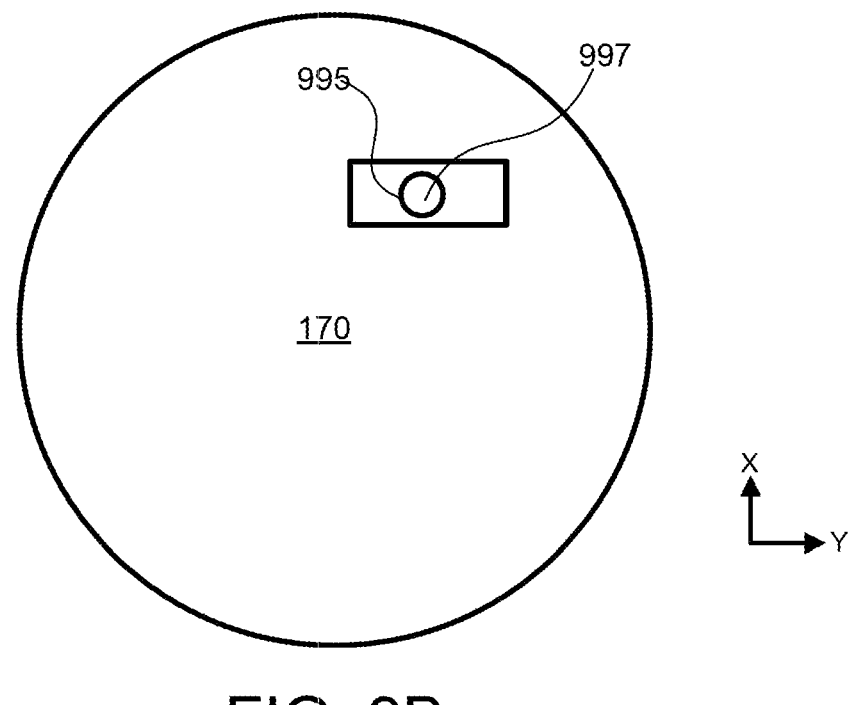

A three-dimensional (3D) semiconductor component is formed in a step S540. FIG. 9A shows a cross-sectional view of an example of a 3D semiconductor component 995. FIG. 9B shows the wafer 170 and the component 995 in the x-y plane at the first plane 878a. The 3D semiconductor component 995 may be a complete component or a portion of a larger component. The 3D semiconductor component 995 may be any type of semiconductor component that has features that are not all formed at one z location in the wafer 170. For example, the 3D semiconductor component may be a device that includes recesses or openings that extend along the z axis. The 3D semiconductor component may be used for any type of electronic application. For example, the 3D semiconductor component may be all or part of a 3D NAND flash memory component. A 3D NAND flash memory is a memory in which memory cells are stacked along the z axis in layers.

In the example of FIG. 9A, the 3D semiconductor component 995 includes a recess 996 that is formed in a periphery 999. The recess 996 includes a floor 997 and a sidewall 998, which extends generally along the z axis between the periphery 999 and the floor 997. The floor 997 is formed by exposing photoresist at the plane 878b with light that is in the second aerial image 873b (FIG. 8A). Features on the periphery 999 are formed using light that is in the first aerial image 873a (FIG. 8A).

Using the process 500 also may result in a sidewall angle 992 being equal to 90° or closer to 90° than is possible with other processes. The sidewall angle 992 is the angle between the floor 997 and the sidewall 998. If the sidewall 998 extends in the x-z plane and the floor extends in the x-y plane, the sidewall angle 992 is 90° and may be considered vertical in this example. A vertical sidewall angle is desirable because, for example, such a sidewall allows for more well-defined features in a 3D semiconductor component. The process 500 achieves a sidewall angle 992 that is equal or close to 90° because the locations of the first aerial image 873a and the second aerial image 873b (the first plane 878a and the second plane 878b, respectively) are separate images that are in different parts of the wafer 170. Forming separate aerial images in a single exposure pass allows the quality of each of the images to be improved resulting in a more defined feature that is more vertically oriented as compared to a feature formed by a single aerial of lower quality.

As described, one implementation of a system to produce vertically displaced images involves using some pulses having a first wavelength and other pulses having a second wavelength. The first wavelength pulses and the second wavelength pulses may be interspersed burst-to-burst or pulse-to-pulse, or in alternating sets with various ratios of the numbers in each set. The wavelength is varied by actuating an EAE inside the optical system, e.g., in the line narrowing module where it determines the impingement angle of the light from a laser cavity onto a diffraction grating. To achieve, for example, alternating pulses of different frequencies, the EAE stage is oscillated back and forth from one angular position to another (dithered) at a high rate.

Figures 10A, 10B:
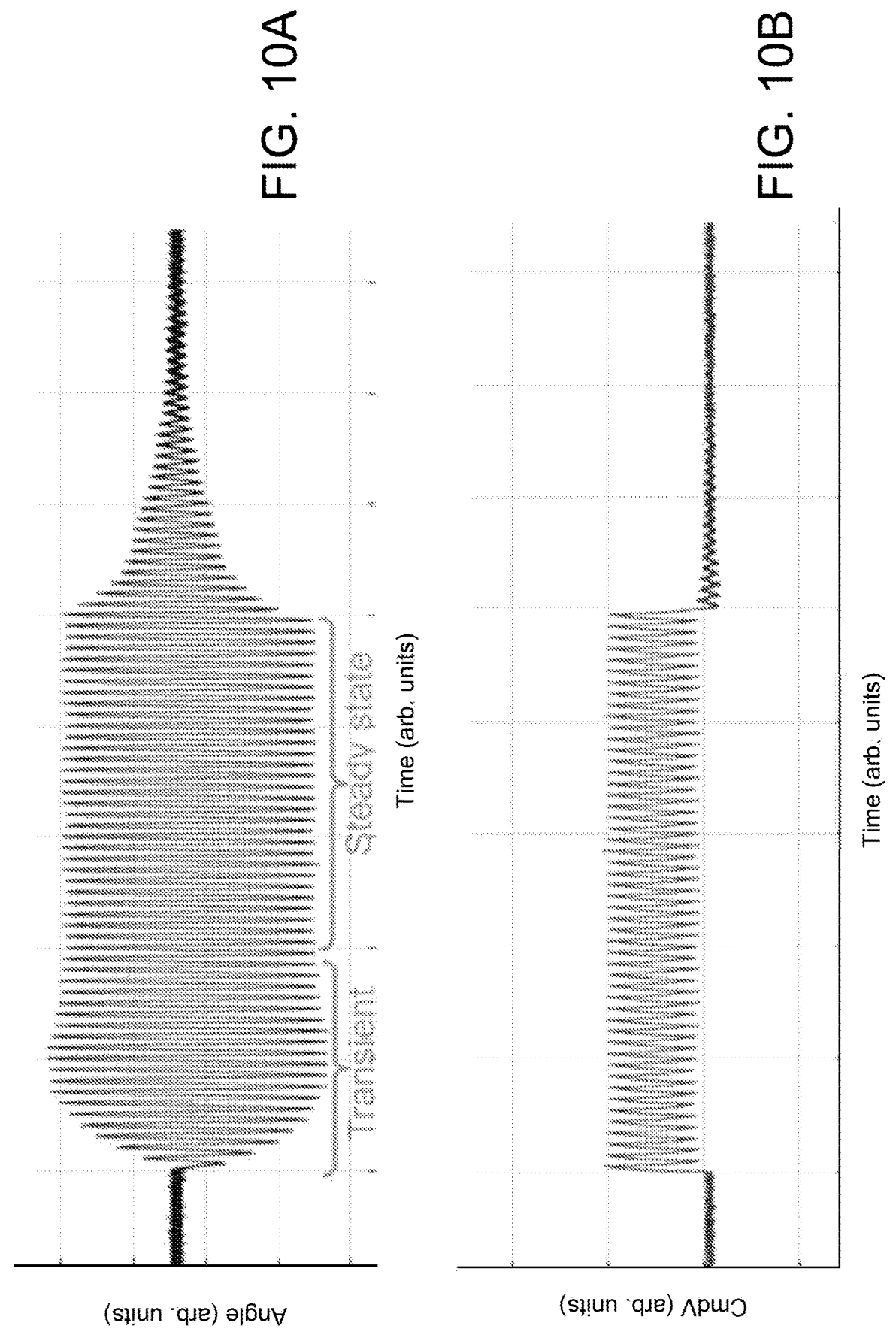

FIG. 10A depicts the dynamics (angle versus time) of typical EAE stage angular motion in response to a fixed amplitude dither voltage. The input voltage profile (EAE voltage versus time) used to achieve the dynamic response is shown in FIG. 10B. As can be seen, at the beginning of a burst, the EAE stage dynamic exhibits an initial transient region which settles down after about 35-40 pulses. During operation in this transient region, the stage angular displacement goes through an initial undershoot region (voltage results in too little motion) due to mechanical inertia followed by an overshoot region (voltage results in excessive motion) before settling down into operation in a steady state region.

In order to shorten the duration of this burst transient and achieve wavelength stability more rapidly, a feedforward scheme may be implemented by generating a transient voltage bin that emulates the inverse behavior of the EAE transient dynamics. The peak-to-peak voltages required to achieve a fixed wavelength peak separation at different pulses in the transient region are thus varied in accordance with the dynamic behavior of the EAE. Large voltage spikes are necessary during the first few pulses of a burst to compensate for the initial undershoot subregion in the transient region. The required voltage amplitude gets significantly lower during the latter part (overshoot subregion) of the transient region in which the tendency for overshoot is inversely compensated. Typically in the transient region a single voltage cap is applied to prevent overshoot.

Figure 11:
FIG. 11 is a graph showing a wavelength profile during the transient region of a burst achieved by a feedforward control algorithm with a maximum voltage cap applied.

FIG. 11 shows the wavelength profile (wavelength error versus pulse index) achieved in the transient region of a burst by applying a command voltage as just described. The command voltage gets saturated at the maximum threshold during the first few pulses, which adversely affects the wavelength peak separation performance for those pulses.

Large wavelength dither requires the EAE to generate substantial displacements. This can be achieved either by running the EAE at a high voltage or by running the EAE closer to its mechanical resonance. In a resonantly driven system, the risk to reliability is large as a small increase in voltage can easily mechanically overdrive the EAE stage and cause physical damage to the EAE.

Maximum threshold caps are used to prevent the EAE stage from being mechanically overdriven so as to reduce the reliability risk. The voltage caps limits the magnitude or maximum value of a voltage signal. In various implementations, the cap may be provided as a voltage cap value or a digital cap value, depending on the form of the signal being regulated. Conventionally, only two maximum thresholds are set, one threshold for the transient region and one threshold for the steady state region.

Figures 12A, 12B:
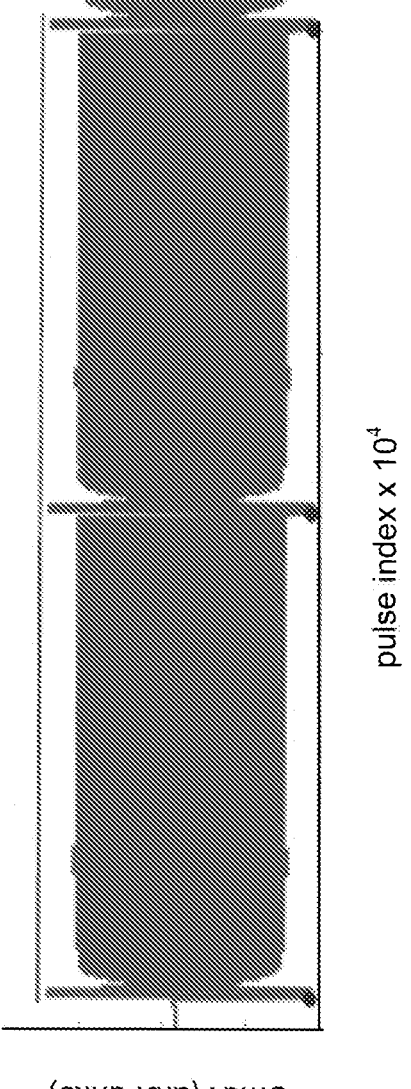
FIG. 12A is a graph depicting an EAE command voltage as a function of pulse index.
FIG. 12B is a graph showing pulse separation error as a function of pulse index for a system in which the EAE is driven using the command voltage waveform of FIG. 12A.

As described above, in order to achieve wavelength stability in the transient region, the required voltage dither amplitude significantly varies between the undershoot and overshoot subregions. This imposes trade-offs in determining a proper value for the voltage cap in the transient region. On one hand setting this cap to a higher value creates a higher risk of damage to the EAE stage under abnormal operating conditions. On the other hand setting the cap to a lower value reduces the control flexibility during the undershoot subregion (e.g., the first 4-5 of pulses of each burst) and impacts the closed loop wavelength performance as depicted in FIGS. 12A and 12B, which show EAE voltage command profile and slit-averaged (average of the fitted centroid wavelength for each spatial pixel along a slit) peak separation error for a test case, with a voltage threshold selected to satisfy the reliability requirement of the EAE stage. As can be seen, peak separation performance is adversely affected during the burst transient when the voltage cap is set purely to meet reliability demands during operation in the overshoot region.

Figure 12C:
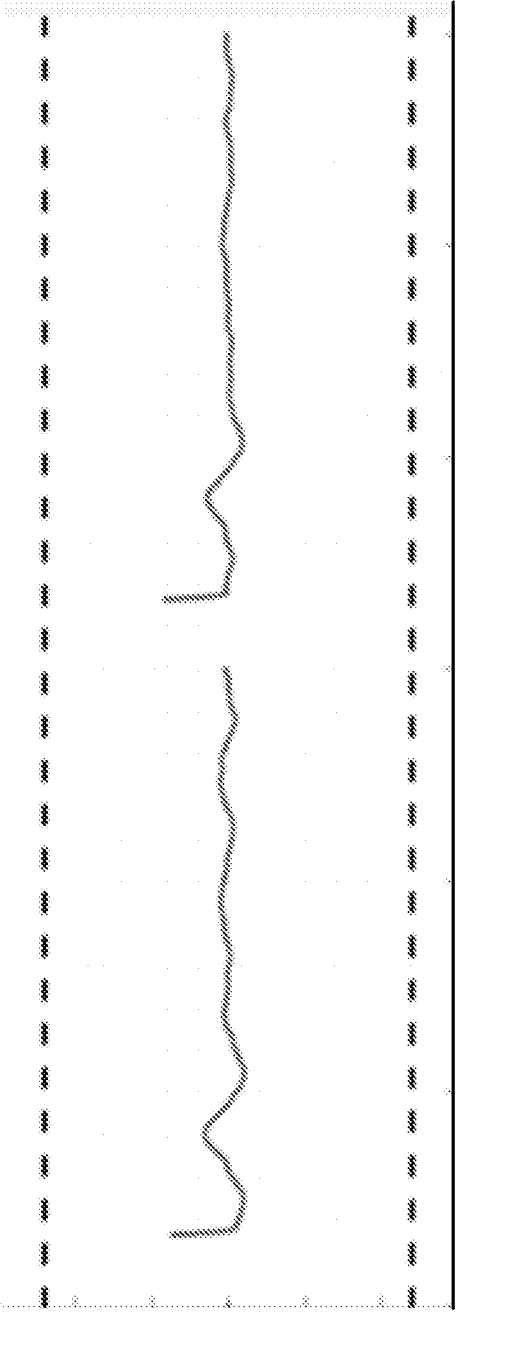
FIG. 12C is a graph showing pulse separation error as a function of pulse index for a system in which the thresholds on the command voltage waveform are relaxed.

On the other hand, peak separation performance is not adversely affected and there is significant beam quality margin, i.e., flexibility, when the voltage threshold is relaxed, i.e., set to a higher level. This is shown in FIG. 12C, which is the slit-averaged peak separation error for a test case, with the voltage threshold relaxed for the entire transient region. relaxing the voltage threshold for the entire transient region, however, compromises the EAE stage reliability.

In other words, if a single value for the voltage cap is applied throughout the entire duration of the transient region, it must typically be set at a compromise value such that the voltage command gets saturated during the initial undershoot subregion. Otherwise the risk of overdriving and damaging the EAE stage is excessive in the overshoot region. Setting the voltage cap at this compromise level, however, has a negative effect on wavelength peak separation error. For example, there may be a long (e.g., few pulses to tens of pulses) tail during the burst transient. Although the impact of this tail on wafer histogram performance is less significant due to the small number of pulses as compared to the total number of pulses in a burst, this wavelength peak separation error can nevertheless generate avoidable beam quality events (e.g., events in which a light pulse has characteristics that are outside of a desired range of performance parameters, or outside an acceptable range of performance parameters). Thus, setting the voltage cap at this compromise level forces a trade-off between reliability and performance.

Figures 13A, 13B:
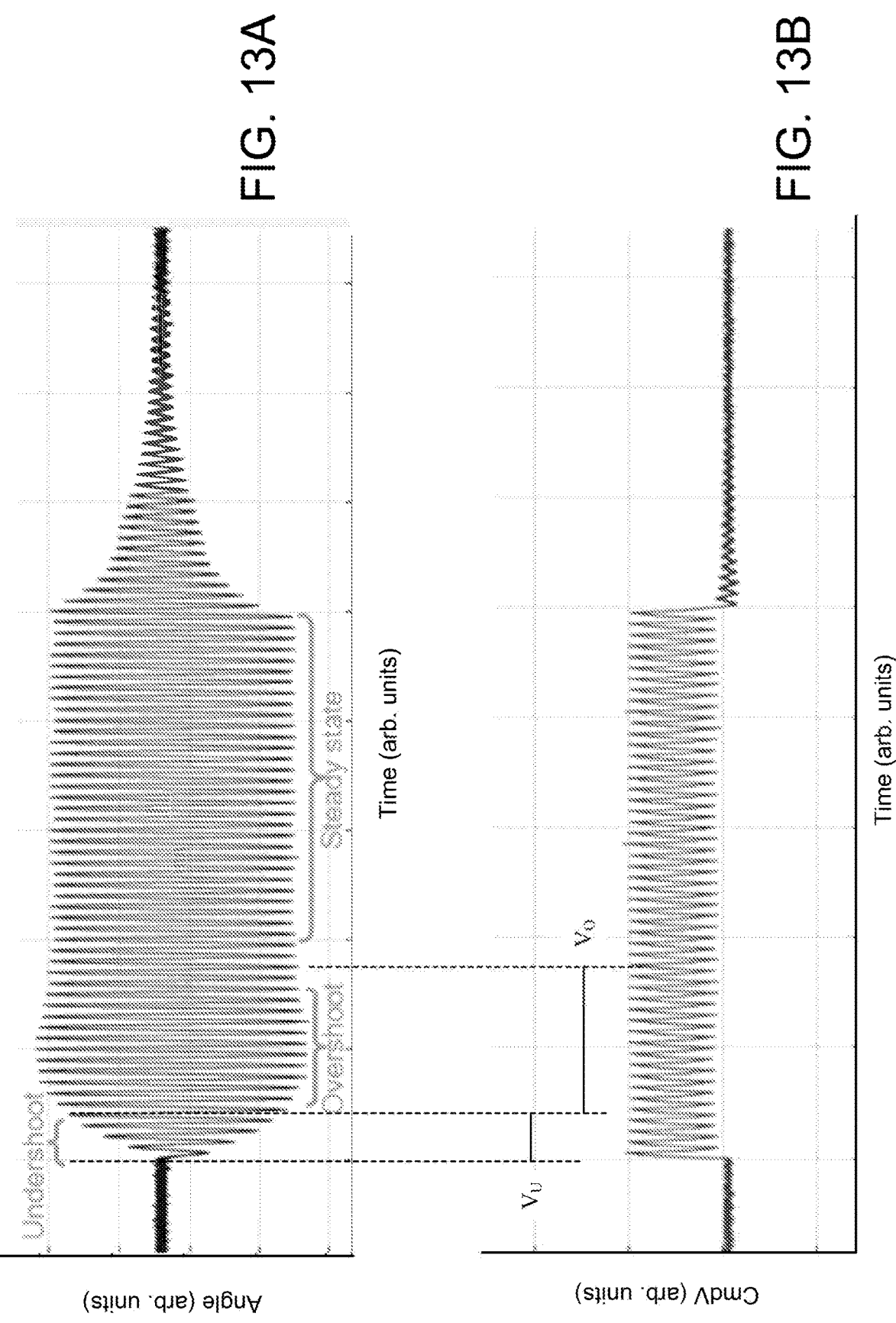
FIG. 13A is a graph depicting the dynamics of a typical EAE stage in response to fixed amplitude dithering voltage showing division of the transient region.
FIG. 13B is a graph showing the fixed amplitude dithering voltage driving the EAE stage used to produce the dynamics shown in FIG. 13A.

To avoid having to make such a compromise, according to an aspect of an embodiment, instead of applying a single maximum voltage threshold throughout the duration of the transient region, different maximum voltage thresholds are applied during different subregions of the transient region. In one aspect, multiple, e.g., two different voltage thresholds are used, one for an undershoot subregion and one for the overshoot subregion, as shown in FIGS. 13A and 13B. This is a nonlimiting example, and it will be apparent that more than two different subregions may be used, even to setting separate thresholds for individual pulses during the burst transient (about first forty pulses) region. For example, as shown in FIG. 13B, during the undershoot region, where risk of mechanical overdrive is very low, the voltage cap may be set to a higher value $V_v$ to allow higher voltage swings and promote better wavelength peak separation performance. On the other hand, during the overshoot region, where the risk of mechanically overdriving the EAE stage, and so of EAE stage failure, is high, the voltage cap may be set to a lower value $V_o$ in order to promote EAE reliability without unduly impacting performance. Having multiple voltage cap zones also enables smooth transitions between the undershoot and overshoot regions.

Although certain parameters such as the resonance frequency and voltage-to-angle gain can vary among different EAE stages, the EAE stage dynamics shown in FIG. 13A may be similar for a variety of EAE stages. For some types of EAE designs, calibration of a voltage threshold profile for the transient region need not be performed more than once and would not need to be modified from module-to-module. The module-to-module variation in resonance frequency and voltage-to-angle gain can be captured, for some designs, by a single multiplication factor that scales the voltage threshold profile as needed.

The voltage caps can be determined heuristically a priori or through the use of a closed loop feedback method as described above.

Thus, according to an aspect of an embodiment, the transient region is divided into multiple sections and voltage control parameters are matched to the transient and sensitivity needs of each section.

Figure 14:
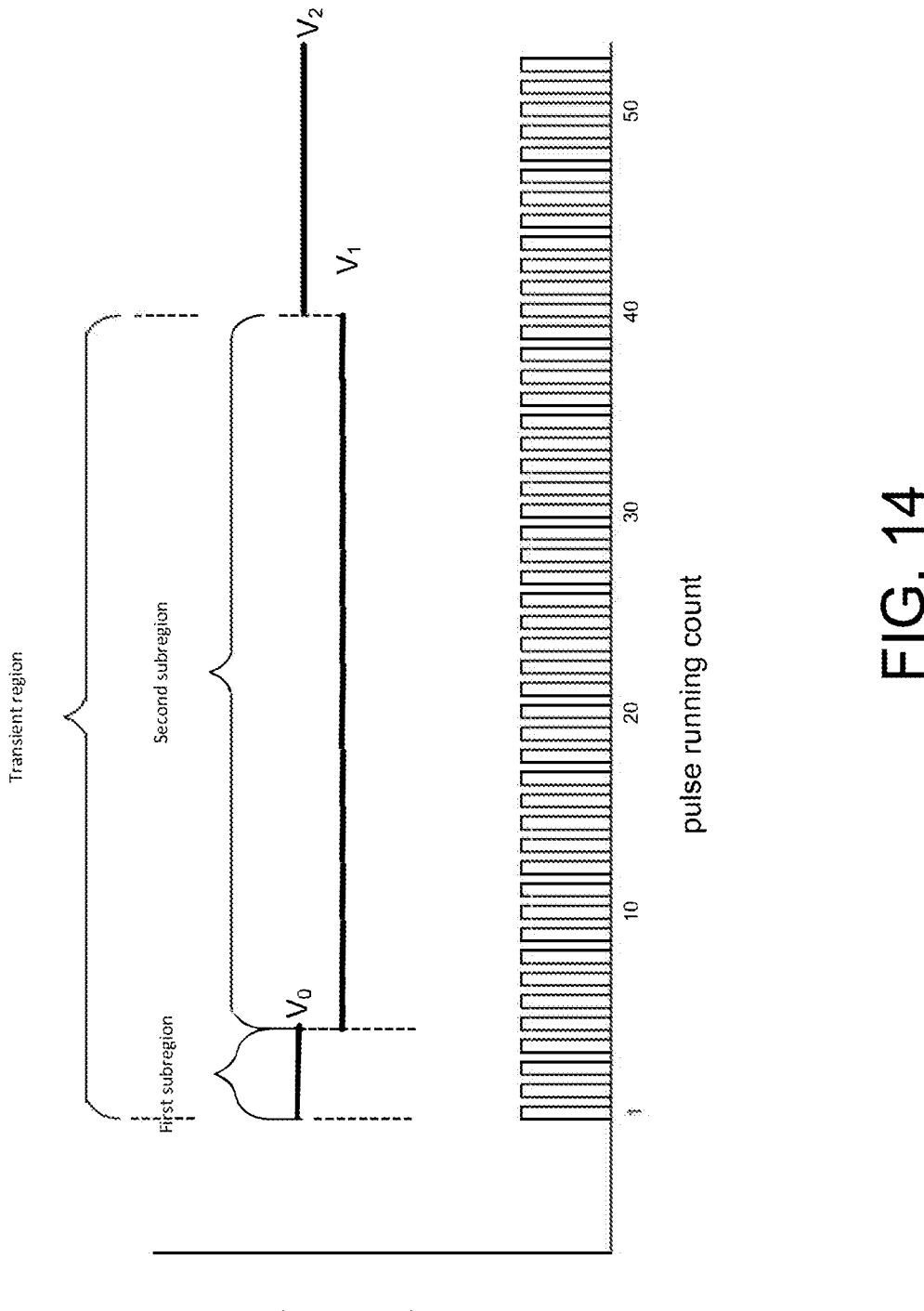
FIG. 14 is a diagram showing threshold voltages as a function of pulse counts.

FIG. 14 is a diagram illustrating certain principles underlying operation of the disclosed systems. In the example shown, the transient region of a burst is divided into two subregions. It will be appreciated, however, that that transient region may be divided into a greater number of subregions. A first voltage threshold or cap or maximum value $V_0$ is applied to the actuator voltage command signal in the first subregion. In the example the first subregion includes the first four pulses of a burst. Again, a different number of pulses could be used. A second voltage threshold or cap or maximum value $V_1$ is applied to the actuator voltage command signal in the second subregion. In the example the second subregion includes pulses five through forty of the burst. Again, a different number of pulses could be used. Then, after the end of the transient region, a third voltage threshold or cap or maximum value $V_2$ is applied for the duration of the burst.

Figure 15:
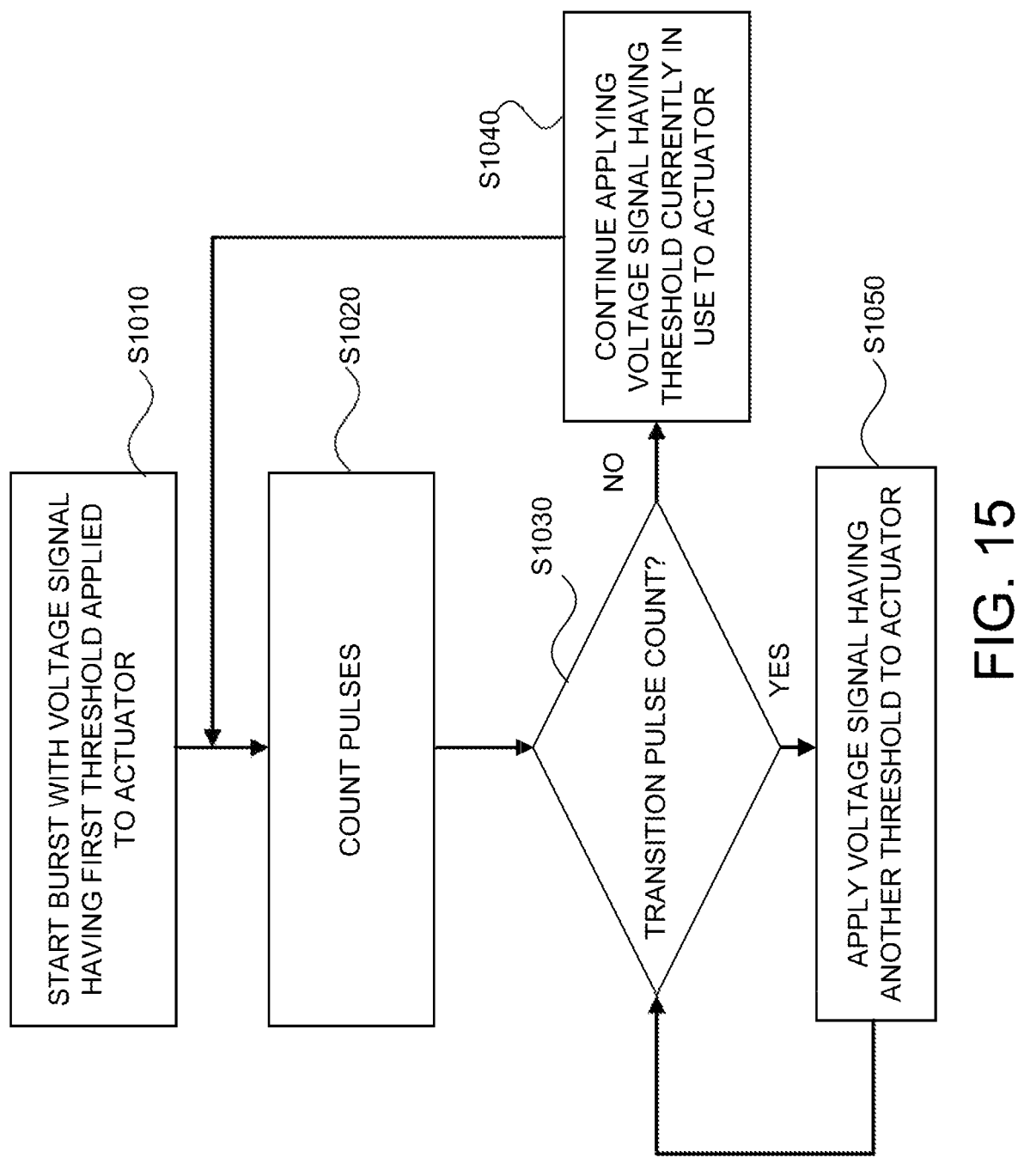
FIG. 15 is a flowchart showing a process for controlling threshold voltages as a function of pulse count.

FIG. 15 is a flowchart of a method in accordance with certain aspects of an embodiment. In a step S1010, a burst is started by a trigger and using a voltage command signal having a first threshold. In a step S1020, a running count of pulses maintained. It will be understood that this step S1020 continues for the duration of the process. In a step S1030 it is determined whether a transition pulse count has been reached. For example, the pulse count could be the number of pulses expected to be in the undershoot region. If the pulse count has not reached a transition value, then in a step 1040 the system continues to apply a voltage command signal having the current threshold. If, however, in the step S1030 it is determined that a transition pulse count has been reached then in a step S1050 a voltage command signal having another threshold is applied to the actuator. The system then reverts to step S1030 again to determine whether the pulse count has reached the value for another transition. This process continues as needed, for example, for the duration of a burst.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The embodiments can be further described using the following clauses:

1. A laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the laser apparatus comprising:
   a trigger for initiating the burst of pulses;
   a pulse counter for providing a running count of a number of pulses that have occurred in the burst of pulses;
   an electro-actuatable element (EAE) mechanically coupled to the optical element to control the position of the optical element under control of a voltage command signal; and
   a voltage controller electrically connected to the EAE; wherein the voltage controller is arranged to receive the running count from the pulse counter, the voltage controller is adapted to generate the voltage command signal, the voltage controller is configured to apply a first voltage cap to the voltage command signal from when the burst is initiated to when the running count is at a first predetermined value, and the voltage controller is configured to apply a second voltage cap to the voltage command signal after the running exceeds the first predetermined value.

2. The laser apparatus of clause 1 wherein the first predetermined value is a running count at which the EAE is at an end of an undershoot region of its voltage response behavior.

3. The laser apparatus of clause 1 wherein the voltage controller applies a third voltage cap to the voltage command signal after the running count exceeds a second predetermined value equal to a running count at which the EAE is at an end of an overshoot region of its voltage response behavior.

4. The laser apparatus of clause 1 wherein the first voltage cap is greater than the second voltage cap.

5. A laser apparatus adapted to generate a first plurality of pulses of laser radiation having a first wavelength interspersed with a second plurality of pulses of laser radiation having a second wavelength different from the first wavelength, the laser apparatus comprising:
   a pulse counter configured to provide a running count of a number of pulses that have occurred since the start of a burst of pulses;
   an electro-actuatable element (EAE) mechanically coupled to the optical element and configured to adjust a position of the optical element under control of a command signal, wherein the respective wavelengths of pulses in the burst of pulses are based at least in part on the position of the optical element; and
   a controller electrically connected to the EAE and arranged to receive the running count from the pulse counter and adapted to generate the command signal, the controller being adapted to change a signal cap applied to the command signal based at least in part on the running count.

6. The laser apparatus of clause 5 wherein the controller is adapted to provide a predetermined signal cap when the running count reaches a predetermined value that corresponds to the EAE being at an end of an undershoot region of its response behavior.

7. The laser apparatus of clause 5 wherein the controller is adapted to provide a predetermined signal cap when the running count reaches a predetermined value that corresponds to the EAE being at an end of an overshoot region of its response behavior.

8. The laser apparatus of clause 5 wherein the controller is adapted to provide a first predetermined signal cap when the running count reaches a first predetermined value that corresponds to the EAE being at an end of an undershoot region of its response behavior, the controller is adapted to provide a second predetermined signal cap when the running count reaches a second predetermined value that corresponds to the EAE being at an end of an overshoot region of its response behavior, and wherein the first predetermined signal cap is greater than the second predetermined signal cap.

9. A method of operating a laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the position of the optical element being determined by an electro-actuatable element (EAE) mechanically coupled to the optical element, the method comprising:
   generating the burst of pulses, and, simultaneously with generating the burst of pulses; counting a number of pulses that have occurred in the burst of pulses to provide a running count of the pulses; and
   generating a command voltage for the EAE, the command voltage having a voltage cap based at least in part on the running count.

10. The method of clause 9 wherein a first voltage cap is applied to the command voltage from when the burst is initiated to when the running count is at a first predetermined value and wherein a second voltage cap is applied to the command voltage when the running count is at a second predetermined value.

11. The method of clause 10 wherein the first predetermined value is a running count at which the EAE is at an end of an undershoot region of its voltage response behavior.

12. The method of clause 10 wherein the second predetermined value is a running count at which the EAE is at an end of an overshoot region of its voltage response behavior.

13. The method of clause 10 wherein the first predetermined value is a running count at which the EAE is at an end of an undershoot region of its voltage response behavior, wherein the second predetermined value is a running count at which the EAE is at an end of an overshoot region of its voltage response behavior, and wherein the first voltage cap is greater than the second voltage cap.

The above described implementations and other implementations are within the scope of the following claims.

The invention claimed is:

1. A laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the laser apparatus comprising:

a trigger for initiating the burst of pulses;

a pulse counter for providing a running count of a number of pulses that have occurred in the burst of pulses;

an electro-actuatable element (EAE) mechanically coupled to the optical element to control the position of the optical element under control of a voltage command signal; and a voltage controller electrically connected to the EAE; wherein the voltage controller is arranged to receive the running count from the pulse counter, the voltage controller is adapted to generate the voltage command signal, the voltage controller is configured to apply a first voltage cap to the voltage command signal from when the burst is initiated to when the running count is at a first predetermined value, and the voltage controller is configured to apply a second voltage cap to the voltage command signal after the running count exceeds the first predetermined value.

2. The laser apparatus of claim 1 wherein the first predetermined value is a running count at which the EAE is at an end of an undershoot region of its voltage response behavior.

3. The laser apparatus of claim 1 wherein the voltage controller is configured to apply a third voltage cap to the voltage command signal after the running count exceeds a second predetermined value equal to a running count at which the EAE is at an end of an overshoot region of its voltage response behavior.

4. The laser apparatus of claim 1 wherein the first voltage cap is greater than the second voltage cap.

5. A laser apparatus adapted to generate a first plurality of pulses of laser radiation having a first wavelength interspersed with a second plurality of pulses of laser radiation having a second wavelength different from the first wavelength based at least in part on a position of an optical element in an optical assembly of the laser apparatus, the laser apparatus comprising:

an electro-actuatable element (EAE) mechanically coupled to the optical element and configured to adjust a position of the optical element under control of a command signal, wherein the respective wavelengths of pulses in the burst of pulses are based at least in part on the position of the optical element; and a controller electrically connected to the EAE and arranged to receive a running count of a number of pulses that have occurred since the start of a burst of pulses and adapted to generate the command signal, the controller being adapted to change a signal cap applied to the command signal based at least in part on the running count.

6. The laser apparatus of claim 5 wherein the controller is adapted to provide a predetermined signal cap when the running count reaches a predetermined value that corresponds to the EAE being at an end of an undershoot region of its response behavior.

7. The laser apparatus of claim 5 wherein the controller is adapted to provide a predetermined signal cap when the running count reaches a predetermined value that corresponds to the EAE being at an end of an overshoot region of its response behavior.

8. The laser apparatus of claim 5 wherein the controller is adapted to provide a first predetermined signal cap when the running count reaches a first predetermined value that corresponds to the EAE being at an end of an undershoot region of its response behavior, the controller is adapted to provide a second predetermined signal cap when the running count reaches a second predetermined value that corresponds to the EAE being at an end of an overshoot region of its response behavior, and wherein the first predetermined signal cap is greater than the second predetermined signal cap.

9. A method of operating a laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the position of the optical element being determined by an electro-actuatable element (EAE) mechanically coupled to the optical element, the method comprising:

generating the burst of pulses, and, simultaneously with generating the burst of pulses;

counting a number of pulses that have occurred in the burst of pulses to provide a running count of the pulses; and generating a command voltage for the EAE, the command voltage having a voltage cap based at least in part on the running count.

10. The method of claim 9 wherein a first voltage cap is applied to the command voltage from when the burst is initiated to when the running count is at a first predetermined value and wherein a second voltage cap is applied to the command voltage when the running count is at a second predetermined value.

11. The method of claim 10 wherein the first predetermined value is a running count at which the EAE is at an end of an undershoot region of its voltage response behavior.

12. The method of claim 10 wherein the second predetermined value is a running count at which the EAE is at an end of an overshoot region of its voltage response behavior.

13. The method of claim 10 wherein the first predetermined value is a running count at which the EAE is at an end of an undershoot region of its voltage response behavior, wherein the second predetermined value is a running count at which the EAE is at an end of an overshoot region of its voltage response behavior, and wherein the first voltage cap is greater than the second voltage cap.

14. A laser apparatus adapted to generate a burst of pulses of laser radiation including a first plurality of pulses of laser radiation having a first wavelength interspersed with a second plurality of pulses of laser radiation having a second wavelength different from the first wavelength based at least in part on a position of an optical element in an optical assembly of the laser apparatus, the laser apparatus comprising:

an electro-actuatable element (EAE) mechanically coupled to the optical element to control the position of the optical element; and a voltage controller electrically connected to the EAE;
   wherein the voltage controller is adapted and configured
      to generate a voltage command signal to control a
      position of the EAE, the voltage control signal having
      a first voltage cap when the EAE is at an end of an
      undershoot region of its voltage response behavior and
      a second voltage cap different from the first voltage cap
      when the EAE is at an end of an overshoot region of its
      voltage response behavior.

15. The laser apparatus of claim 14 wherein the voltage
controller is adapted and configured to apply the first voltage
cap to the command voltage from when the burst is initiated
to when a running count of pulses in the burst is at a first
predetermined value and to apply a second voltage cap to the
command voltage when the running count of pulses in the
burst is at a second predetermined value.

16. The laser apparatus of claim 15 wherein the first
predetermined value is a running count at which the EAE is
at an end of an undershoot region of its voltage response
behavior.

17. The laser apparatus of claim 15 wherein the second
predetermined value is a running count at which the EAE is
at an end of an overshoot region of its voltage response
behavior.

18. The laser apparatus of claim 15 wherein the first
predetermined value is a running count at which the EAE is
at an end of an undershoot region of its voltage response
behavior, wherein the second predetermined value is a
running count at which the EAE is at an end of an overshoot
region of its voltage response behavior, and wherein the first
voltage cap is greater than the second voltage cap.

* * * * *